United States Patent
Takeda et al.

(10) Patent No.: US 8,110,335 B2
(45) Date of Patent: *Feb. 7, 2012

(54) RESIST PATTERNING PROCESS AND MANUFACTURING PHOTO MASK

(75) Inventors: Takanobu Takeda, Jyoetsu (JP); Satoshi Watanabe, Jyoetsu (JP); Tamotsu Watanabe, Jyoetsu (JP); Akinobu Tanaka, Jyoetsu (JP); Keiichi Masunaga, Jyoetsu (JP); Ryuji Koitabashi, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 197 days.

This patent is subject to a terminal disclaimer.

(21) Appl. No.: 12/457,544

(22) Filed: Jun. 15, 2009

(65) Prior Publication Data

US 2010/0009271 A1    Jan. 14, 2010

(30) Foreign Application Priority Data

Jul. 11, 2008   (JP) ................. 2008-181848

(51) Int. Cl.
*G03F 7/00*   (2006.01)
*G03F 7/004*   (2006.01)
*G03F 7/26*   (2006.01)
*G03F 7/40*   (2006.01)

(52) U.S. Cl. ............... 430/270.1; 430/311; 430/322; 430/330; 430/331

(58) Field of Classification Search .......... 430/270.1, 430/311, 322, 330, 331, 7
See application file for complete search history.

(56) References Cited

U.S. PATENT DOCUMENTS

| | | | |
|---|---|---|---|
| RE37,179 E | 5/2001 | Yamachika et al. | |
| 7,109,311 B2 * | 9/2006 | Ohsawa et al. | 534/558 |
| 7,267,923 B2 * | 9/2007 | Takeda et al. | 430/270.1 |
| 7,282,305 B2 * | 10/2007 | Shoki et al. | 430/5 |
| 7,374,860 B2 * | 5/2008 | Hirano et al. | 430/270.1 |
| 7,501,223 B2 * | 3/2009 | Takeda et al. | 430/270.1 |
| 7,541,131 B2 * | 6/2009 | Kawanishi | 430/270.1 |

(Continued)

FOREIGN PATENT DOCUMENTS

EP   1684118 A1 *   7/2006

(Continued)

OTHER PUBLICATIONS

Written Opinion in Singaporean Patent Application No. 200904470-2; dated Apr. 10, 2010.

(Continued)

*Primary Examiner* — Amanda C. Walke
(74) *Attorney, Agent, or Firm* — Oliff & Berridge, PLC

(57) ABSTRACT

There is disclosed a resist patterning process with a minimum line width of 65 nanometers or less may be formed by using a resist composition containing a polymer, as a base polymer of a chemically-amplified resist composition, composed of a styrene unit whose hydroxyl group is protected by an acid labile group, and an indene unit, and/or an acenaphthalene unit, wherein the polymer has the weight-average molecular weight of 4,000 to 7,000, and in particular, 4,500 to 5,500. One of the currently existing problems to be solved is the line edge roughness. To solve this problem by an acid-generator and a basic compound, there is a problem of the trade-off relationship with a resolution power. There can be provided a resist composition having a high resolution containing a base polymer such as hydroxystyrene that is protected by an acid labile group, a resist patterning process with a pattern rule of 65 nanometers or less having a reduced line edge roughness.

9 Claims, 1 Drawing Sheet

U.S. PATENT DOCUMENTS

| | | | |
|---|---|---|---|
| 7,618,763 B2* | 11/2009 | Takeda et al. | 430/270.1 |
| 7,704,668 B1* | 4/2010 | Cameron et al. | 430/270.1 |
| 7,851,130 B2* | 12/2010 | Kawanishi et al. | 430/270.1 |
| 7,887,991 B2* | 2/2011 | Hatakeyama et al. | 430/270.1 |
| 2007/0105042 A1 | 5/2007 | Takeda et al. | |
| 2007/0231738 A1 | 10/2007 | Kaneko et al. | |
| 2008/0090172 A1 | 4/2008 | Hatakeyama et al. | |
| 2008/0096128 A1 | 4/2008 | Takeda et al. | |
| 2010/0009286 A1* | 1/2010 | Takeda et al. | 430/270.1 |

FOREIGN PATENT DOCUMENTS

| | | | |
|---|---|---|---|
| EP | 1 783 551 A2 | | 5/2007 |
| EP | 1783551 A2 | * | 5/2007 |
| JP | A-62-240953 | | 10/1987 |
| JP | A-05-132513 | | 5/1993 |
| JP | A-07-209868 | | 8/1995 |
| JP | A-2002-062652 | | 2/2002 |
| JP | A-2007-132998 | | 5/2007 |
| JP | A-2007-297590 | | 11/2007 |
| JP | 2008095009 A | * | 4/2008 |
| JP | A-2008-095009 | | 4/2008 |
| JP | A-2008-122932 | | 5/2008 |

OTHER PUBLICATIONS

Oct. 26, 2009 Search Report issued in European Patent Application No. 09 00 7999.

* cited by examiner

[Fig.1]
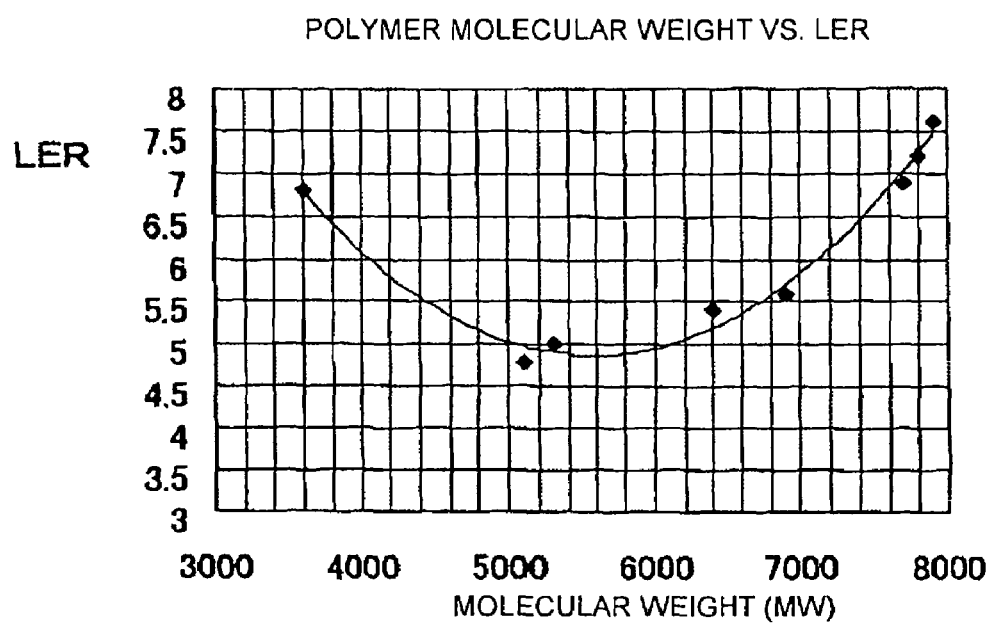

though a line edge roughness is large. This problem of a line edge roughness had already been noted in the formation of a pattern with about 0.2 micrometers, and been generally solved by selection of materials such as an acid-generator, a basic compound, and the like, and by control of an amount of an additive. However, a solution by an acid-generator and a basic compound is merely an operation to increase slightly a diffusion length of an acid. Given that a maximum resolution is attained by control of a diffusion length of an acid, there is a trade-off relationship with resolution.

RESIST PATTERNING PROCESS AND MANUFACTURING PHOTO MASK

BACKGROUND OF THE INVENTION

1. Field of the Invention

The present invention relates to a photo resist used for fine processing of a semiconductor, a photo mask blank, and so forth, in particular, a resist patterning process with regard to a chemically-amplified type resist used in a KrF excimer laser, an EUV, and an electronic beam, and a method for manufacturing a photo mask.

2. Description of the Related Art

It is well known that, as LSI progresses toward a high integration and a further acceleration in speed, a miniaturization of a pattern rules is required. With this trend, an exposure method and a resist composition have been largely changed, and in particular, when performing a lithography of a pattern with 0.2 micrometer or less, a KrF or an ArF excimer laser or an electronic beam, and the like are used as a light source, while an EUV is about to be used for a pattern rule with less than 30 nanometers. Because, in a photo resist used in a lithography method like this, a good sensitivity to such high energy beams as mentioned above is necessary, a number of chemically-amplified types giving a high sensitivity and a high resolution power have been developed.

Among these photo resists, various kinds of a base polymer to form a resist pattern used in a positive resist have been proposed. A positive resist having been actually used is based on a mechanism with which it is made soluble into an alkaline developer by eliminating an acid-labile protecting group, which protects an acidic functional group at side chain of a base polymer, by an acid as its catalyst that is generated by exposing a high energy beam to an acid generator. Accordingly, a molecular weight of a base polymer added in a resist composition does not change before and after a light-exposure.

On the other hand, control of a resist pattern profile is based on whether or not dissolution properties of polymers in a resist film after the light-exposure can be controlled at a micro level. Accordingly, from a considerably early stage of practical use of a chemically-amplified resist, control of the molecular weight dispersion of a base polymer has been drawing an attention (Japanese Patent Laid-Open Application No. H5-132513).

Although prior patents and the like mentioned various aspects of the molecular weight of a base polymer, when a base polymer of polyhydroxystyrene is actually used, the weight-average molecular weight (Mw) of about 8,000 to 15,000 has been generally used. In fact, in the case of a resist using an acetal-protected polyhydroxystyrene, the one with Mw of about 5,000 showed a tendency to form a resist pattern with a round head rather than a rectangular head, and the one with too large Mw, for example 20,000 or more, showed a tendency to leave behind a scum caused by re-adhering of a dissolved or partly-dissolved polymer after dissolution.

As to a base polymer obtained by radical polymerization of polyhydroxystyrene, an acrylic acid derivative protected by an acid labile group, and further a unit not dissolvable in an alkaline developer such as styrene, for example, a use of a base polymer slightly larger than a comparative example of polyhydroxystyrene is disclosed in Japanese Patent Laid-Open Application No. H7-209868.

However, in the development of a photo resist using an acrylic acid type polymer, it was found that a considerably large amount of scum were formed in the case of Mw of about 10,000, if a conventional method was followed. Accordingly, as disclosed in Japanese Patent Laid-Open Application No. 2008-122932 and so forth, Mw of about 5,000 to 9,000 are generally used in many cases.

A resist using a base polymer, which is a copolymer of hydroxystyrene and a cycloolefin containing an aromatic ring and is insolubilized into an alkaline developer by protecting with an acetal protecting group, proposed by inventors of the present invention (for example, Japanese Patent Laid-Open Application No. 2007-132998, Japanese Patent Laid-Open Application No. 2008-95009, and so forth), is a useful photo resist having high resolution and etching resistance. The resist disclosed there had Mw of specifically about 9,000 to 15,000, and yet they showed no problem of the scum as mentioned above.

Resist compositions disclosed in Japanese Patent Laid-Open Application No. 2007-132998, Japanese Patent Laid-Open Application No. 2008-95009, and so on are useful materials to form fine patterns especially by a high energy beam such as an electronic beam and an EUV, and its important application is for processing of a photo mask blank. A circuit drawn on a photo mask is projected with a reduced size by one-fourth in a exposure. However, this does not mean that a line width of the mask pattern may allow to be 4-folds relative to an intended pattern rule, and it is processed to a more complicated pattern (a pattern applied with a so-called OPC, Optical Proximity Correction, and the like) than an actual circuit pattern in order to correct a light diffraction and the like. Accordingly, in a mask processing to manufacture a semiconductor having, for example, a 45 nanometers pattern rule, eventually a resist to resolve a 45 nanometers pattern is necessary. For this reason, further improvement of a resist to manufacture a photo mask to resolve a pattern with 45 nanometers or less is desired.

SUMMARY OF THE INVENTION

As miniaturization of a target pattern rule progresses, one currently existing problem to be solved is a line edge roughness. Fluctuation of a line width of a resolved resist pattern is called as a line edge roughness. Even though a fine resist pattern is separated, lithography may not be performed as designed as far as a line edge roughness is large. This problem of a line edge roughness had already been noted in the formation of a pattern with about 0.2 micrometers, and been generally solved by selection of materials such as an acid-generator, a basic compound, and the like, and by control of an amount of an additive. However, a solution by an acid-generator and a basic compound is merely an operation to increase slightly a diffusion length of an acid. Given that a maximum resolution is attained by control of a diffusion length of an acid, there is a trade-off relationship with resolution.

Accordingly, a main object of the present invention is, in a resist composition with a high resolution and a high etching resistance containing, as a base polymer, a copolymer formed of a hydroxystyrene protected by an acid labile group and a cyclic olefin having an aromatic ring, to provide a resist patterning process to be used for processing of a semiconductor having a further reduced line edge roughness with a pattern rule of 65 nanometers or less and even 45 nanometers or less and for precision processing of a photo mask blank and the like for it.

Inventors of the present invention investigated extensively to achieve the above-mentioned object and found that a resist pattern with a high resolution and a small line edge roughness may be obtained even if a pattern with a minimum line width or space width is 65 nanometers or less is formed, when a chemically-amplified positive resist composition is made by using a base polymer having a weight-average molecular weight of less than those that have been considered to be best in the past, namely 4,000 to 7,000, in particular 4,500 to 5,500, wherein the polymer comprises one or more monomer unit represented by the following general formula (1), and one or more monomer unit represented by the following general formula (2) and/or one or more monomer unit represented by the following general formula (3), wherein the sum of the monomers represented by the formulae (1) to (3) relative to total monomer units of the polymer is 95 mol % or more, the amount of monomer units with t being one or more is 70 mol % or more relative to total monomer unit of the formula (1) when two or more monomers represented by the formula (1) are contained, the sum of monomer units represented by the formulae (2) and (3) relative to total monomer units of the polymer is 5 to 30 mol %, and a phenolic hydroxyl group in the monomer unit represented by the formula (1) is partly protected by an acid labile protecting group. In addition, they found that, in production of a photo mask for manufacturing of a semiconductor with a pattern rule of 65 nanometers or less, use of the resist composition as mentioned above made possible to form a fine resist pattern, and thus accomplished the present invention.

Namely, the present invention is a resist patterning process with a minimum line width or a minimum space width being 65 nanometers or less on a processing substrate, comprising a step of coating a chemically-amplified positive resist composition containing a base polymer on a processing substrate; a step of removing an excess solvent component remained in a coated layer by heating to obtain a resist film; pattern-exposing a high energy beam; and a step of developing by using a developer, if necessary after a light-exposure and then a heat-treatment, wherein the base polymer is a polymer comprising at least one or more monomer unit represented by the following general formula (1) (however, it always contains a unit with t being one or more):

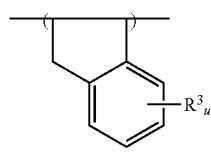

(1)

wherein $R^1$ represents any of a hydrogen atom or a methyl group; and $R^2$ represents a hydrocarbon group, or an alkoxy hydrocarbon group, having 1 to 6 carbon atoms, wherein t represents an integer of 0 to 2; and s represents an integer of 0 to 4, and $0 \leq s+t \leq 5$, and one or more monomer unit represented by the following general formula (2);

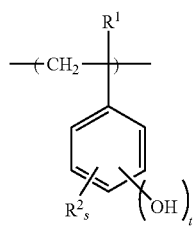

(2)

wherein $R^3$ represents any of a hydroxyl group, a hydrocarbon group, or an alkoxy hydrocarbon group, having 1 to 6 carbon atoms, wherein u represents an integer of 0 to 4 and/or one or more monomer unit represented by the following general formula (3);

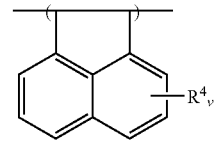

(3)

wherein $R^4$ represents any of a hydroxyl group, a hydrocarbon group, or an alkoxy hydrocarbon group, having 1 to 6 carbon atoms, wherein v represents an integer of 0 to 4, wherein the sum of the monomers represented by the formulae (1) to (3) relative to total monomer units of the polymer is 95 mol % or more, the amount of monomers with t being one or more is 70 mol % or more relative to total monomer units of the formula (1) when two or more monomers represented by the formula (1) are contained, the sum of monomer units represented by the formulae (2) and (3) relative to total monomer units of the polymer is 5 to 30 mol %, wherein a weight-average molecular weight of the polymer is 4,000 to 7,000, and a phenolic hydroxyl group in the monomer unit represented by the formula (1) is partly protected by an acid labile protecting group.

Contrary to a conventionally used base polymer with a type of polyhydroxystyrene having a molecular weight of 8,000 to 15,000, surprisingly enough in the polymer as mentioned above, a line edge roughness could be made smaller than those of conventional ones, and a high resolution could be obtained without forming round heads, by lowering its molecular weight rather than by controlling of amounts of an acid generator and a basic compound.

In addition, the weight-average molecular weight is preferably 4,500 to 5,500.

Further, the acid labile protecting group to protect a phenolic hydroxyl group in the monomer unit represented by general formula (1) is preferably an acetal group represented by the general formula (4):

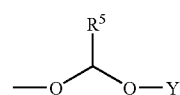

(4)

wherein $R^5$ represents a hydrogen atom, or a linear, a branched, or a cyclic alkyl group having 1 to 10 carbon atoms; and Y represents a linear, a branched, or a cyclic (including polycyclic) alkyl group having 1 to 30 carbon atoms.

By adopting the acetal group as mentioned above as the acid labile protecting group, a further high resolution may be obtained.

The present invention is a method for producing a photo mask for manufacturing of a semiconductor device with a pattern rule of 65 nanometers or less, wherein the method includes a step of processing a photo mask blank by forming a resist pattern on the mask blank by the resist patterning process according to any of the above.

By using the resist composition as mentioned above, a high resolution and a small line edge roughness may be attained simultaneously. Accordingly, a high reliability may be rendered to a process for producing a photo mask used to manufacture a semiconductor by a pattern rule of 65 nanometers or less, in particular 45 nanometers or less, where securing a reliability has been difficult.

In the present invention, a composition containing, as a base polymer, a polymer containing a styrene unit having a hydroxyl group and an hydroxyl group protected by an acid-decomposable group, and an indene unit and/or an acenaphthalene unit, whose weight-average molecular weight is 4,000 to 7,000, in particular 4,500 to 5,500, is used to form a resist pattern. With this, a resist pattern having an excellent line edge roughness (LER) could be obtained even when a pattern with a minimum line width (width of a remaining resist pattern) or a minimum space width (width between a remaining resist pattern and a resist pattern) being 65 nanometers or less is formed. Furthermore, by using an acetal group of an aliphatic polycyclic alkyl group having 7 or more carbon atoms as a protection group, a resist pattern with an excellent LER could be obtained even when a pattern with 45 nanometers or less is formed. In addition, as a result, improvement of a reliability of lithography in production of a photo mask for manufacturing a semiconductor with a pattern rule of 65 nanometers or less, or even a pattern rule of 45 nanometers or less, could be attained.

BRIEF DESCRIPTION OF THE DRAWING

FIG. 1 shows a relationship between the molecular weight (Mw) of the polymer and the line edge roughness (LER).

DETAILED DESCRIPTION OF THE PREFERRED EMBODIMENTS

The present invention further improved a resist composition having a high etching resistance disclosed in Japanese Patent Laid-Open Application No. 2007-132998, Japanese Patent Laid-Open Application No. 2008-95009, and so on by inventors of the present invention, thereby enabled easy manufacturing of a semiconductor with a pattern rule of 65 nanometers or less, in particular a semiconductor requiring an extremely fine resist pattern such as 45 nanometers or less, where a high precision is difficult to be obtained, and production of a photo mask used therein.

Even if a pattern formation was made by using a resist composition containing a polymer with a molecular weight disclosed in Examples of Japanese Patent Laid-Open Application No. 2007-132998, Japanese Patent Laid-Open Application No. 2008-95009, a relatively high resolution could be obtained without problems such as a scum caused by re-adhesion of a dissolved polymer after development at that time, but there was a demerit of sacrificing a resolution power slightly if a line edge roughness was tried to be made smaller. However, in the case where there is no problem such as a scum generally, if a molecular weight is decreased, there are possibilities that a pattern profile is deteriorated, and that even a line edge roughness becomes larger because the contrast is decreased. Contrary to the expectation, however, when inventors of the present invention daringly attempted to use a lower molecular weight, they found that a line edge roughness and a resolution were improved at the same time.

A base polymer used in a resist composition of the present invention is a base polymer mainly composed of the followings. Namely, it is a base polymer comprising at least one or more monomer unit represented by the following general formula (1) (however, it always contains a unit with t being one or more):

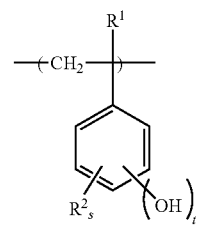

wherein $R^1$ represents a hydrogen atom or a methyl group; and $R^2$ represents a hydrocarbon group, or an alkoxy hydrocarbon group, having 1 to 6 carbon atoms, wherein t represents an integer of 0 to 2; and s represents an integer of 0 to 4, and one or more monomer unit represented by the following general formula (2);

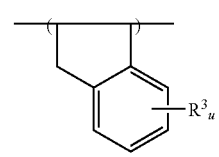

wherein $R^3$ represents any of a hydroxyl group, a hydrocarbon group, or an alkoxy hydrocarbon group, having 1 to 6 carbon atoms, wherein u represents an integer of 0 to 4 and/or one or more monomer unit represented by the following general formula (3);

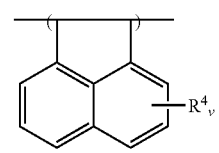

wherein $R^4$ represents a hydroxyl group, a hydrocarbon group, or an alkoxy hydrocarbon group, having 1 to 6 carbon atoms; and v represents an integer of 0 to 4, wherein a weight-average molecular weight of the polymer is 4,000 to 7,000, and a phenolic hydroxyl group in the monomer unit represented by the general formula (1) is partly protected by an acid labile protecting group.

In the polymer as mentioned above, the sum of units represented by the general formulae (1) to (3) is 95 mol % or more and preferably 98 mol % or more relative to total monomer units in the polymer, and in addition, when the units represented by the general formula (1) contains 2 or more monomer units, the content of the unit with t being one or more (however, here it means the sum of a protected and an unprotected hydroxyl group) relative to total units represented by the formula (1) is 70 mol % or more, preferably 85 mol % or more, and more preferably 100 mol %, and in addition, the sum of monomer units represented by the general formulae (2) and (3) is 5 to 30 mol % relative to the total monomer units in the polymer.

Basic skeleton of the base polymer as mentioned above is composed of mainly any of the following; a styrene unit (the above general formula (1)) and an indene unit (the above general formula (2)); a styrene unit and an acenaphthylene unit (the above general formula (3)); or a styrene unit, the indene unit, and the acenaphthylene unit. Optionally, it may contain other unit like a (meth)acrylic acid ester protected with an acid labile group such as tertiary alkyl group or having an acid-stable group.

The styrene unit contains a hydrogen group or a methyl group in its α-position ($R^1$), wherein the unit contains a hydroxyl group or a hydroxyl group optionally protected by an acid labile group in the amount of preferably 70 mol % or more, more preferably 80 mol % or more, and further more preferably 100 mol %, relative to total styrene units. Further, in a polymer protected by an acid labile group, the content of a unit having an unprotected hydroxyl group is 5 mol % or more and 80 mol % or less, and preferably 30 mol % or more and 80 mol % or less, relative to total monomer units of the polymer. The content of a unit having a hydroxyl group protected by an acid labile group is more than 0 mol % and 50 mol % or less, and more preferably 10 mol % or more and 30 mol % or less, relative to total monomer units of the polymer.

Other substituent group, which may be substituted in the styrene unit, may be exemplified by a hydrocarbon group having 1 to 6 carbon atoms or an alkoxy hydrocarbon group. Examples of the hydrocarbon group include a methyl group, an ethyl group, a propyl group, a butyl group, a pentyl group, a cyclopentyl group, a hexyl group, a cyclohexyl group, and a phenyl group, including its isomers.

Any of the indene unit and the acenaphthlene unit may be substituted by a hydroxyl group, a hydrocarbon group having 1 to 6 carbon atoms, or an alkoxy hydrocarbon group. Examples of the hydrocarbon group include a methyl group, an ethyl group, a propyl group, a butyl group, a pentyl group, a cyclopentyl group, a hexyl group, a cyclohexyl group, and a phenyl group, including its isomers. As disclosed in Japanese Patent Laid-Open Application No. 2008-122932, these units render a high etching resistance to a resist layer obtained from a resist composition, and in addition, it is assumed from the results of the present invention that they also render an effect of a desirable pattern profile in a low molecular weight. The content of these units is preferably 5 to 30 mol %, and more preferably 5 to 20 mol %, relative to total monomer units in the polymer. When the content is less than 5 mol %, the property that an etching resistance is high is not clearly seen, and when the content is more than 30 mol %, to control its molecular weight and to have reproducibility of polymerization are sometimes difficult.

The weight-average molecular weight of the base polymer as mentioned above is preferably 4,000 to 7,000, and more preferably 4,500 to 5,500 as measured by a generally used method using a gel permeation chromatography (GPC) with polystyrene as a standard sample. When the weight-average molecular weight is less than 4,000, a resolution is decreased due to round pattern heads and a line edge roughness is deteriorated, as has been known in past. On the contrary, when it is more than 7,000, a phenomenon that a line edge roughness is clearly seen appears easily. Accordingly, the weight-average molecular weight is preferably 4,000 or more and 7,000 or less, and more and most preferably in an extremely narrow range of 4,500 or more and 5,500 or less.

Furthermore, in the polymer used in the present invention, its molecular weight distribution (Mw/Mn) is preferably 1.0 to 2.0, in particular in a narrow dispersion range of 1.0 to 1.8. When the molecular weight distribution is wide, there are risks of forming foreign spots on a pattern and deteriorating a pattern profile in a certain case.

As an acid labile group, decomposable by an acid, to protect the hydroxyl group in the general formula (1), an acetal group, a tertiary alkyl group, and the like may be used, but an acetal group represented by the following general formula (4) is preferable because it gives a high resolution:

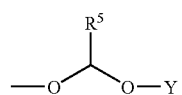

(4)

wherein $R^5$ represents a hydrogen atom, or a linear, a branched, or a cyclic alkyl group having 1 to 10 carbon atoms; and Y represents a linear, a branched, or a cyclic (including polycyclic) alkyl group having 1 to 30 carbon atoms.

Although Y in the formula (4) is a linear, a branched, or a cyclic (including polycyclic) alkyl group having 1 to 30 carbon atoms, preferably it includes a polycyclic alkyl group having 7 to 30 carbon atoms. When Y includes a polycyclic alkyl group, it is preferable that a secondary carbon atom constituting the polycyclic structure form a bond with an acetal oxygen atom. Because, if the bond is formed on a tertiary carbon atom in a cyclic structure, a polymer becomes labile, thereby lacking in a storage stability as a resist composition and leading to deterioration of a resolution. On the other hand, if Y is bonded on a primary carbon atom via a linear alkyl group having one or more carbon atom, a glass transition temperature (Tg) of the polymer is lowered, thereby risking to deteriorate a resist pattern profile by baking after development in a certain case.

As a preferable general formula (4), the following groups may be exemplified:

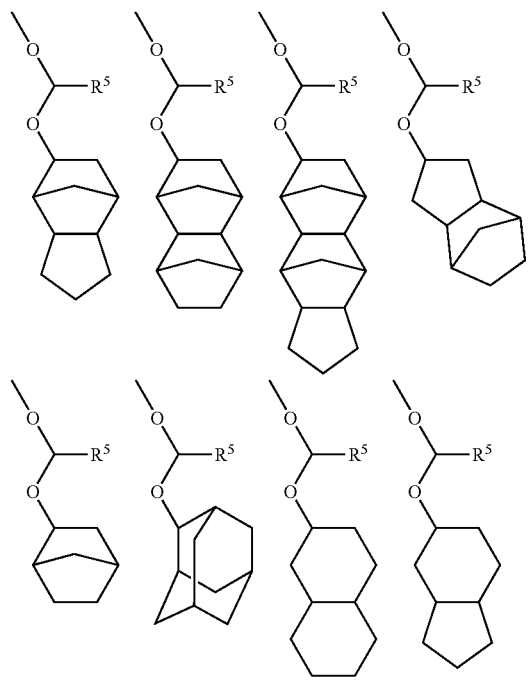

wherein $R^5$ represents a hydrogen atom, or a linear, a branched, or a cyclic alkyl group having 1 to 10 carbon atoms, and may be arbitrarily selected according to design of sensitivity of the decomposable group to an acid. For example, when the design is made to decompose by a strong acid with securing a relatively high stability, a hydrogen atom may be selected. When the design is made to have a high sensitivity to a change in pH by utilizing a relatively high reactivity, a linear alkyl group may be selected. When a relatively bulky alkyl group is substituted at a terminal as shown in the above, which is designed to cause a large change in solubility by decomposition, a carbon atom having a bond with the acetal carbon as $R^5$ is preferably a secondary carbon, though it depends on a combination of an acid-generator and a basic compound contained in a resist composition. Examples of $R^5$ bonded with an acetal carbon by a secondary carbon include an isopropyl group, a sec-butyl group, a cyclopentyl group, and cyclohexyl group.

Production of the polymer as mentioned above may be done by a number of polymerization methods known in skills in the art, namely by a radical polymerization method and a cationic polymerization method. When the polymer is produced by a radical polymerization, a monomer pre-introduced by an acid-decomposable group (in this case, an acid labile protecting group is introduced to a phenolic OH group) is used, in a similar manner to polymerization of a (meth) acrylic acid derivative already protected by an acid-decomposable protecting group and an acetoxy styrene (for example, Japanese Patent Laid-Open Publication No. 2002-62652), and as to a unit having a free phenolic hydroxyl group, there is also a method in which polymerization is performed in the state of acetoxylated, and then de-acetoxylation is performed. However, when a cationic polymerization is performed or protection is made by a sensitive acetal group, a method in which a polymer without protected is produced by polymerization and is then followed by its protection is preferable.

The above-mentioned radical polymerization method and de-acetoxylation reaction are well known, and are also disclosed in Japanese Patent Laid-Open Application No. 2007-132998, Japanese Patent Laid-Open Application No. 2008-95009. As a base for an alkaline hydrolysis, an aqueous ammonia solution, triethyl amine, and the like may be used. The reaction temperature is −20 to 100° C., and preferably 0 to 60° C., and the reaction time is 0.2 to 100 hours, and preferably 0.5 to 30 hours.

As a method for protecting the polymer after polymerization, a method using a vinyl ether and an acid catalyst (for example, Japanese Patent Laid-Open Application No. 2008-95009), a method using an acetal-forming agent containing a haloalkoxy group and a base (for example, Japanese Patent Laid-Open Application No. 2007-132998), and the like are known, and any of them may be used here.

For example, in the case of a method using a vinyl ether and an acid catalyst, the acid catalyst to be used in the reaction may be exemplified by methanesulfonic acid, trifluoroacetic acid, oxalic acid, methanesulfonic acid pyridine salt, and the like. The reaction temperature is preferably 5 to 20° C., and the reaction time is 0.2 to 10 hours and preferably 0.5 to 5 hours.

In the case of a method using an acetal-forming agent and a base, an acetal-forming agent represented by the following general formula (5):

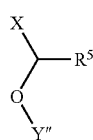

(5)

wherein X represents a chlorine atom, a bromine atom, an iodine atom; and Y″ represents an alkyl group having 1 to 30 carbon atoms or an aryl group, is added dropwise into a polymer solution in the presence of a basic compound such as triethyl amine and the like. The reaction temperature is preferably −20 to 50° C., and the reaction time is 0.2 to 10 hours and preferably 0.5 to 5 hours, though they are just rough indications, and thus the method is not restricted to these methods.

In addition to a base polymer, other polymer may be added exceptionally. For example, a polymer containing, as an alkaline-soluble group, a hydroxyl group with improved acidity due to a presence of a fluorine atom near to it, such as a (meth)acrylate ester type (Japanese Patent Laid-Open Publication No. 2007-297590) and a hydroxystyrene type (Japanese Patent Laid-Open Publication No. S62-240953), has been known. These materials change a state of a resist film surface and have an effect to improve an inner homogeneity of a pattern surface. In addition, a generally used polymer such as hydroxystyrene-(meth)acryolate ester copolymer may also be added in such a range as not to impair effects of the present invention. The content of such a polymer is preferably not more than 30% by weight, and more preferably 10% or less by weight, relative to total polymers, though it is not necessary to be added if intended only to have the effects of the present invention.

Examples of an organic solvent to dissolve a solid component in order to make a chemically-amplified positive resist composition of the present invention applicable for coating include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propyleneglycol monomethyl ether, propyleneglycol monoethyl ether, propyleneglycol monomethyl ether propionate, propyleneglycol monoethyl ether propionate, ethyleneglycol monomethyl ether, ethyleneglycol monoethyl ether, diethyleneglycol monomethyl ether, diethyleneglycol monoethyl ether, 3-methyl-3-methoxybutanol, N-methylpyrrolidone, dimethyl sulfoxide, γ-butyrolactone, propyleneglycol methyl ether acetate, propyleneglycol ethyl ether acetate, propylenegylcol propyl ether acetate, methyl lactate, ethyl lactate, propyl lactate, and tetramethylene sulfone, but are not restricted to the above-mentioned solvents. In particular, a propyleneglycol alkyl ether acetate and a lactic acid alkyl ester are preferable. These solvents may be used singly or in a mixture of two or more kinds. A preferable example of the mixed solvent is that of a propyleneglycol alkyl ether acetate and a lactic acid alkyl ester. Here, an alkyl group of a propyleneglycol alkyl ether acetate is the one having 1 to 4 carbon atoms, and for example, a methyl group, an ethyl group, a propyl group, and the like may be mentioned, while a methyl group and an ethyl group are preferable. A propyleneglycol alkyl ether acetate has a 1,2-, and a 1,3-substituted form, and there are three isomers depending on a combinations of positions of substituents, wherein they may be used singly or a mixture thereof. An alkyl group in the lactic acid alkyl ester is the one having 1 to 4 carbon atoms, and may include, for example, a methyl group, an ethyl group, and a propyl group, but a methyl group and an ethyl group are preferable.

When a resist used in an light exposure is prepared, a propyleneglycol alkyl ether acetate is preferably selected mainly as the organic solvent because the amount of an acid-generator to be added is relatively controlled to be low, in this case, its content is preferably 50% or more by weight relative to total solvents. A lactic acid alkyl ester or propyleneglycol monoalkyl ether is preferably selected as a co-solvent to be added.

When a resist used in an electronic beam exposure is prepared, a lactic acid alkyl ester or propyleneglycol monoalkyl ether having a hydroxyl group is preferably selected mainly as the organic solvent because the amount, of an acid-generator to be added is relatively large, in this case, the content of each or mixture of them is preferably 50% or more by weight relative to total solvents. Furthermore, When a mixed solvent of a propyleneglycol alkyl ether acetate and a lactic acid alkyl ester and/or propyleneglycol monoalkyl ether is used as a solvent, their sum is preferably 50% or more, and more preferably 80% or more by weight relative to total solvents. In this case, it is further preferable that the content of a propyleneglycol alkyl ether acetate be 20 to 95% by weight and a lactic acid alkyl ester and/or propyleneglycol monoalkyl ether be 5 to 80% by weight, the rate is decided by calculating the amount of the acid-generator to be added as described above. When the content of a propyleneglycol alkyl ether acetate is too small, there are problems of deterioration of coating properties and the like, and when it is too much, there are problems of insufficient solubility and formation of particles and foreign matters. When the content of a lactic acid alkyl ester and/or propyleneglycol monoalkyl ether is too small, there are problems of insufficient solubility, formation of particles and foreign matters, and the like, and when it is too much, there are problems of poor coating properties due to high viscosity, and in addition, deterioration of storage stability and the like. The amount of these solvents to be added relative to 100 parts by weight of a solid component in a chemically-amplified positive resist composition is 300 to 2,000 parts by weight, and preferably 400 to 1,000 parts by weight, but not restricted to them as far as the concentration is such that a conventional coating method is applicable.

As an photo acid-generator contained in a resist composition to be used in the present invention, any compound may be used as far as it generates an acid by irradiation of a high energy beam. An photo acid-generator with types of a sulfonium salt, an iodonium salt, a sulfonyl diazomethane, an N-sulfonyl oxyimide type, and the like may be used preferably. These will be explained in detail in the following, and may be used singly or as a mixture of two or more kinds.

A sulfonium salt is formed of a sulfonium cation and a sulfonate, bis(substituted alkylsulfonyl)imide, or tris(substituted alkylsulfonyl)methide. Examples of the sulfonium cation include triphenyl sulfonium, 4-tert-butoxyphenyl diphenyl sulfonium, bis(4-tert-butoxyphenyl)phenyl sulfonium, tris(4-tert-butoxyphenyl)sulfonium, 3-tert-butoxyphenyl diphenyl sulfonium, bis(3-tert-butoxyphenyl)phenyl sulfonium, tris(3-tert-butoxyphenyl)sulfonium, 3,4-di-tert-butoxyphenyl diphenyl sulfonium, bis(3,4-di-tert-butoxyphenyl)phenyl sulfonium, tris(3,4-di-tert-butoxyphenyl)sulfonium, diphenyl(4-thiophenoxyphenyl)sulfonium, 4-tert-butoxycarbonylmethyloxyphenyl diphenyl sulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 4-methylphenyl diphenyl sulfonium, 4-tert-butylphenyl diphenyl sulfonium, bis(4-methylphenyl)phenyl sulfonium, bis(4-tert-butylphenyl)phenyl sulfonium, tris(4-methylphenyl)sulfonium, tris(4-tert-butylphenyl)sulfonium, tris(phenylmethyl)sulfonium, 2-naphthyl diphenyl sulfonium, dimethyl (2-naphtyl)sulfonium, 4-hydroxyphenyl dimethyl sulfonium, 4-methoxyphenyl dimethyl sulfonium, trimethyl sulfonium, 2-oxocyclohexyl cyclohexyl methyl sulfonium, trinaphtyl sulfonium, tribenzyl sulfonium, diphenyl methyl sulfonium, dimethyl phenyl sulfonium, 2-oxopropyl thiacyclopentanium, 2-oxobutyl thiacyclopentanium, 2-oxo-3,3-dimethyl thiacyclopentanium, 2-oxo-2-phenylethyl thiacyclopentanium, 4-n-butoxynaphtyl-1-thiacyclopentanium, and 2-n-butoxynaphthyl-1-thiacyclopentanium. Examples of the sulfonate include trifluoromethane sulfonate, pentafluoroethane sulfonate, heptafluoropropane sulfonate, nonafluorobutane sulfonate, tridecafluorohexane sulfonate, perfluoro(4-ethylcyclohexane)sulfonate, heptadecafluorooctane sulfonate, 2,2,2-trifluoroethane sulfonate, pentafluorobenzene sulfonate, 4-(trifluoromethyl)benzene sulfonate, 4-fluorobenzene sulfonate, mesitylene sulfonate, 2,4,6-trisiopropylbenzene sulfonate, toluene sulfonate, benzene sulfonate, 4-(p-toluenesulfonyloxy)benzene sulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy)naphthalene-1-sulfonate, naphthalene sulfonate, camphor sulfonate, octane sulfonate, dodecylbenzene sulfonate, butane sulfonate, methane sulfonate, 1,1-difluoro-2-naphthylethane sulfonate, 1,1,2,2-tetrafluoro-2-(norbornane-2-yl)ethane sulfonate, 1,1,2,2-tetrafluoro-2-(tetracyclo[4.4.0.1$^{2,5}$.1$^{7,10}$]dodeca-3-ene-8-yl)ethane sulfonate, 2-benzoyloxy-1,1,3,3,3-pentafluoropropane sulfonate, 1,1,3,3,3-pentafluoro-2-(4-phenylbenzoyloxy)propane sulfonate, 1,1,3,3,3-pentafluoro-2-pivaloyloxypropane sulfonate, 2-cyclohexanecarbonyloxy-1,1,3,3,3-pentafluoropropane sulfonate, 1,1,3,3,3-pentafluoro-2-furoyloxypropane sulfonate, 2-naphthoyloxy-1,1,3,3,3-pentafluoropropane sulfonate, 2-(4-tert-butylbenzoyloxy)-1,1,3,3,3-pentafluoropropane sulfonate, 2-(1-adamantanecarbonyloxy)-1,1,3,3,3-pentafluoropropane sulfonate, 2-acetyloxy-1,1,3,3,3-pentafluoropropane sulfonate, 1,1,3,3,3-pentafluoro-2-hydroxypropane sulfonate, 1,1,3,3,3-pentafluoro-2-tosyloxypropane sulfonate, 1,1-difluoro-2-tosyloxyethane sulfonate, adamantanemethoxycarbonyl difluoromethane sulfonate, 1-(3-hydroxymethyladamantane)methoxycarbonyl difluoromethane sulfonate, methoxycarbonyl difluoromethane sulfonate, 1-(hexahydro-2-oxo-3,5-methano-2H-cyclopenta[b]furane-6-yloxycarbonyl)difluoromethane sulfonate, and 4-oxo-1-adamantyloxycarbonyl difluoromethane sulfonate. Examples of the bis(substituted alkylsulfonyl)imide include bis(trifluoromethylsulfonyl)imide, bis(pentafluoroethylsulfonyl)imide, bis(heptafluoropropylsulfonyl)imide, and perfluoro(1,3-propylenebissulfonyl)imide. Examples of tris(substituted alkylsulfonyl)methide include tris(trifluoromethylsulfonyl)methide. Sulfonium salts formed of combinations of the above may be exemplified.

An iodonium salt is formed of an iodonium cation and a sulfonate, bis(substituted alkylsulfonyl)imide, or tris(substituted alkylsulfonyl)methide. Examples of the iodonium cation include diphenyl iodonium, bis(4-tert-butylphenyl)iodonium, 4-tert-butoxyphenyl phenyl iodonium, and 4-methoxyphenyl phenyl iodonium. Examples of the sulfonate include trifluoromethane sulfonate, pentafluoroethane sulfonate, heptafluoropropane sulfonate, nonafluorobutane sulfonate, tridecafluorohexane sulfonate, perfluoro(4-ethylcyclohexane)sulfonate, heptadecafluorooctane sulfonate, 2,2,2-trifluoroethane sulfonate, pentafluorobenzene sulfonate, 4-(trifluoromethyl)benzene sulfonate, 4-fluorobenzene sulfonate, mesitylene sulfonate, 2,4,6-trisiopropylbenzene sulfonate, toluene sulfonate, benzene sulfonate, 4-(p-toluenesulfonyloxy)benzene sulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p- toluenesulfonyloxy)naphthalene-1-sulfonate, naphthalene sulfonate, camphor sulfonate, octane sulfonate, dodecylbenzene sulfonate, butane sulfonate, methane sulfonate, 1,1-difluoro-2-naphthylethane sulfonate, 1,1,2,2-tetrafluoro-2-(norbornane-2-yl)ethane sulfonate, 1,1,2,2-tetrafluoro-2-(tetracyclo[4.4.0.1$^{2,5}$.1$^{7,10}$]dodeca-3-ene-8-yl)ethane sulfonate, 2-benzoyloxy-1,1,3,3,3-pentafluoropropane sulfonate, 1,1,3,3,3-pentafluoro-2-(4-phenylbenzoyloxy)propane sulfonate, 1,1,3,3,3-pentafluoro-2-pivaloyloxypropane sulfonate, 2-cyclohexanecarbonyloxy-1,1,3,3,3-pentafluoropropane sulfonate, 1,1,3,3,3-pentafluoro-2-furoyloxypropane sulfonate, 2-naphthoyloxy-1,1,3,3,3-pentafluoropropane sulfonate, 2-(4-tert-butylbenzoyloxy)-1,1,3,3,3-pentafluoropropane sulfonate, 2-(1-adamantanecarbonyloxy)-1,1,3,3,3-pentafluoropropane sulfonate, 2-acetyloxy-1,1,3,3,3-pentafluoropropane sulfonate, 1,1,3,3,3-pentafluoro-2-hydroxypropane sulfonate, 1,1,3,3,3-pentafluoro-2-tosyloxypropane sulfonate, 1,1-difluoro-2-tosyloxyethane sulfonate, adamantanemethoxycarbonyl difluoromethane sulfonate, 1-(3-hydroxymethyladamantane)methoxycarbonyl difluoromethane sulfonate, methoxycarbonyl difluoromethane sulfonate, 1-(hexahydro-2-oxo-3,5-methano-2H-cyclopenta[b]furane-6-yloxycarbonyl)difluoromethane sulfonate, and 4-oxo-1-adamantyloxycarbonyl difluoromethane sulfonate. Examples of the bis (substituted alkylsulfonyl)imide include bis (trifluoromethylsulfonyl)imide, bis (pentafluoroethylsulfonyl)imide, bis (heptafluoropropylsulfonyl)imide, and perfluoro(1,3-propylenebissulfonyl)imide. Examples of tris(substituted alkylsulfonyl)methide include tris(trifluoromethylsulfonyl) methide. Iodonium salts formed of combinations of the above may be exemplified.

Examples of the sulfonyl diazomethane include a bissulfonyl diazomethane and a sulfonylcarbonyl diazomethane such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(4-acetyloxyphenylsulfonyl)diazomethane, bis(4-methanesulfonyloxy)phenylsulfonyl)diazomethane, bis(4-(p-toluenesulfonyloxy)phenylsulfonyl)diazomethane, bis(4-n-hexyloxyphenylsulfonyl)diazomethane, bis(2-methyl-4-n-hexyloxyphenylsulfonyl)diazomethane, bis(2,5-dimethyl-4-n-hexyloxyphenylsulfonyl)diazomethane, bis(3,5-dimethyl-4-n-hexyloxyphenylsulfonyl)diazomethane, bis(2-methyl-5-isopropyl-4-n-hexyloxy)phenylsulfonyl diazomethane, bis (2-naphthylsulfonyl)diazomethane, 4-methylphenylsulfonyl benzoyl diazomethane, tert-butylcarbonyl-4-methylphenylsulfonyl diazomethane, 2-naphthylsulfonyl benzoyl diazomethane, 4-methylphenylsulfonyl-2-naphthoyl diazomethane, methylsulfonyl benzoyl diazomethane, and tert-butoxycarbonyl-4-methylphenylsulfonyl diazomethane.

Examples of the photo acid-generator in the type of an N-sulfonyloxydicarboxy imide include combinations of an imide skeleton such as succinic imide, naphthalene dicarboxy imide, phthalic imide, cyclohexyl dicarboxy imide, 5-norbornene-2,3-dicarboxy imide, and 7-oxabicylco[2.2.1]-5-heptene-2,3-dicarboxy imide with trifluoromethane sulfonate, pentafluoroethane sulfonate, heptafluoropropane sulfonate, nonafluorobutane sulfonate, tridecafluorohexane sulfonate, perfluoro(4-ethylcyclohexane)sulfonate, heptadecafluorooctane sulfonate, 2,2,2-trifluoroethane sulfonate, pentafluorobenzene sulfonate, 4-(trifluoromethyl)benzene sulfonate, 4-fluorobenzene sulfonate, mesitylene sulfonate, 2,4,6-trisiopropylbenzene sulfonate, toluene sulfonate, benzene sulfonate, 4-(p-toluenesulfonyloxy)benzene sulfonate, 6-(p-toluenesulfonyloxy)naphthalene-2-sulfonate, 4-(p-toluenesulfonyloxy)naphthalene-1-sulfonate, 5-(p-toluenesulfonyloxy)naphthalene-1-sulfonate, 8-(p-toluenesulfonyloxy) naphthalene-1-sulfonate, naphthalene sulfonate, camphor sulfonate, octane sulfonate, dodecylbenzene sulfonate, butane sulfonate, methane sulfonate, 1,1-difluoro-2-naphthylethane sulfonate, 1,1,2,2-tetrafluoro-2-(norbornane-2-yl) ethane sulfonate, 1,1,2,2-tetrafluoro-2-(tetracyclo[4.4.0.1$^{2,5}$.1$^{7,10}$]dodeca-3-ene-8-yl)ethane sulfonate, 2-benzoyloxy-1,1,3,3,3-pentafluoropropane sulfonate, 1,1,3,3,3-pentafluoro-2-(4-phenylbenzoyloxy)propane sulfonate, 1,1,3,3,3-pentafluoro-2-pivaloyloxypropane sulfonate, 2-cyclohexanecarbonyloxy-1,1,3,3,3-pentafluoropropane sulfonate, 1,1,3,3,3-pentafluoro-2-furoyloxypropane sulfonate, 2-naphthoyloxy-1,1,3,3,3-pentafluoropropane sulfonate, 2-(4-tert-butylbenzoyloxy)-1,1,3,3,3-pentafluoropropane sulfonate, 2-(1-adamantanecarbonyloxy)-1,1,3,3,3-pentafluoropropane sulfonate, 2-acetyloxy-1,1,3,3,3-pentafluoropropane sulfonate, 1,1,3,3,3-pentafluoro-2-hydroxypropane sulfonate, 1,1,3,3,3-pentafluoro-2-tosyloxypropane sulfonate, 1,1-difluoro-2-tosyloxyethane sulfonate, adamantanemethoxycarbonyl difluoromethane sulfonate, 1-(3-hydroxymethyladamantane)methoxycarbonyl difluoromethane sulfonate, methoxycarbonyl difluoromethane sulfonate, 1-(hexahydro-2-oxo-3,5-methano-2H-cyclopenta[b]furane-6-yloxycarbonyl)difluoromethane sulfonate, and 4-oxo-1-adamantyloxycarbonyl difluoromethane sulfonate.

An acid-generator in the type of an O-arylsulfonyl oxim compound or of an O-alkylsulfonium oxim compound (oxime sulfonate) may be exemplified by, a glyoxime derivative type, an oxime sulfonate type having a long conjugated system via a thiophene and an cyclohexadine group, an oxime sulfonate type with an improved stability by an electron-withdrawing group such as a trifluoromethyl group, an oxime sulfonate type using a phenyl acetonitrile and a substituted acetonitrile derivative, and a bisoxime sulfonate type.

Examples of the photo acid-generator in the type of a glyoxime derivative include bis-O-(p-toluenesulfonyl)-α-dimethyl glyoxime, bis-O-(p-toluenesulfonyl)-α-diphenyl glyoxime, bis-O-(p-toluenesulfonyl)-α-dicyclohexyl glyoxime, bis-O-(p-toluenesulfonyl)-2,3-pentanedione dioxime, bis-O-(n-butanesulfonyl)-α-dimethyl glyoxime, bis-O-(n-butanesulfonyl)-α-diphenyl glyoxime, bis-O-(n-butanesulfonyl)-α-dicyclohexyl glyoxime, bis-O-(methanesulfonyl)-α-dimethyl glyoxime, bis-O-(trifluoromethanesulfonyl)-α-dimethyl glyoxime, bis-O-(2,2,2-trifluoroethanesulfonyl)-α-dimethyl glyoxime, bis-O-(10-camphorsulfonyl)-α-dimethyl glyoxime, bis-O-(benzenesulfonyl)-α-dimethyl glyoxime, bis-O-(4-fluorobenzenesulfonyl)-α-dimethyl glyoxime, bis-O-(4-trifluoromethylbenzenesulfonyl)-α-dimethyl glyoxime, bis-O-(xylenesulfonyl)-α-dimethyl glyoxime, bis-O-(trifluoromethanesulfonyl)-nioxime, bis-O-(2,2,2-trifluoroethanesulfonyl)-nioxime, bis-O-(10-camphorsulfonyl)-nioxime, bis-O-(benzenesulfonyl)-nioxime, bis-O-(4-fluorobenzenesulfonyl)-nioxime, bis-O-(4-(trifluoromethyl)benzenesulfonyl)-nioxime, and bis-O-(xylenesulfonyl)-nioxime. In addition, the above-mentioned skeletons substituted by the followings may be mentioned; 2-benzoyloxy-1,1,3,3,3-pentafluoropropane sulfonate, 1,1,3,3,3-pentafluoro-2-(4-phenylbenzoyloxy)propane sulfonate, 1,1,3,3,3-pentafluoro-2-pivaloyloxypropane sulfonate, 2-cyclohexanecarbonyloxy-1,1,3,3,3-pentafluoropropane sulfonate, 1,1,3,3,3-pentafluoro-2-furoyloxypropane sulfonate, 2-naphthoyloxy-1,1,3,3,3-pentafluoropropane sulfonate, 2-(4-tert-butylbenzoyloxy)-1,1,3,3,3-pentafluoropropane sulfonate, 2-(1-adamantanecarbonyloxy)-1,1,3,3,3-pentafluoropropane sulfonate, 2-acetyloxy-1,1,3,3,3-pentafluoropropane sulfonate, 1,1,3,3,3-pentafluoro-2-hydroxypropane sulfonate, 1,1,3,3,3-pentafluoro-2-tosyloxypropane sulfonate, 1,1-difluoro-2-tosyloxyethane sulfonate, adamantanemethoxycarbonyl difluoromethane sulfonate, 1-(3-hydroxymethyladamantane)methoxycarbonyl difluoromethane sulfonate, methoxycarbonyl difluoromethane sulfonate, 1-(hexahydro-2-oxo-3,5-methano-2H-cyclopenta[b]furane-6-yloxycarbonyl)difluoromethane sulfonate, and 4-oxo-1-adamantyloxycarbonyl difluoromethane sulfonate.

Examples of the photo acid-generator in the type of an oxime sulfonate having a long conjugated system via a thiophene and an cyclohexadine group include (5-(p-toluenesulfonyl)oxyimino-5H-thiophene-2-iridene)phenyl acetonitrile, (5-(10-camphorsulfonyl)oxyimino-5H-thiophene-2-iridene)phenyl acetonitrile, (5-n-octanesulfonyloxyimino-5H-thiophene-2-iridene)phenyl acetonitrile, (5-(p-toluenesulfonyl)oxyimino-5H-thiophene-2-iridene)(2-methylphenyl)acetonitrile, (5-(10-camphorsulfonyl)oxyimino-5H-thiophene-2-iridene)(2-methylphenyl) acetonitrile, (5-n-octanesulfonyloxyimino-5H-thiophene-2-iridene)(2-methylphenyl) acetonitrile, (5-(4-(p-toluenesulfonyloxy)benzenesulfonyl)oxyimino-5H-thiophene-2-iridene)phenyl acetonitrile, and (5-(2,5-bis(p-toluenesulfonyloxy)benzenesulfonyl)oxyimino-5H-thiophene-2-iridene)phenyl acetonitrile. In addition, the above-mentioned skeletons substituted by the followings may be mentioned; 2-benzoyloxy-1,1,3,3,3-pentafluoropropane sulfonate, 1,1,3,3,3-pentafluoro-2-(4-phenylbenzoyloxy)propane sulfonate, 1,1,3,3,3-pentafluoro-2-pivaloyloxypropane sulfonate, 2-cyclohexanecarbonyloxy-1,1,3,3,3-pentafluoropropane sulfonate, 1,1,3,3,3-pentafluoro-2-furoyloxypropane sulfonate, 2-naphthoyloxy-1,1,3,3,3-pentafluoropropane sulfonate, 2-(4-tert-butylbenzoyloxy)-1, 1,3,3,3-pentafluoropropane sulfonate, 2-(1-adamantanecarbonyloxy)-1,1,3,3,3-pentafluoropropane sulfonate, 2-acetyloxy-1,1,3,3,3-pentafluoropropane sulfonate, 1,1,3,3,3-pentafluoro-2-hydroxypropane sulfonate, 1,1,3,3,3-pentafluoro-2-tosyloxypropane sulfonate, 1,1-difluoro-2-tosyloxyethane sulfonate, adamantanemethoxycarbonyl difluoromethane sulfonate, 1-(3-hydroxymethyladamantane)methoxycarbonyl difluoromethane sulfonate, methoxycarbonyl difluoromethane sulfonate, 1-(hexahydro-2-oxo-3,5-methano-2H-cyclopenta[b]furane-6-yloxycarbonyl)difluoromethane sulfonate, and 4-oxo-1-adamantyloxycarbonyl difluoromethane sulfonate.

Examples of the photo acid-generator in the type of an oxime sulfonate with an improved stability by an electron-withdrawing group such as a trifluoromethyl group include 2,2,2-trifluoro-1-phenylethanone=O-(methylsulfonyl) oxime, 2,2,2-trifluoro-1-phenylethanone=O-(10-camphorsulfonyl)oxime, 2,2,2-trifluoro-1-phenylethanone=O-(4-methoxybenzenesulfonyl)oxime, 2,2,2-trifluoro-1-phenylethanone=O-(1-naphthylsulfonyl)oxime, 2,2,2-trifluoro-1-phenylethanone=O-(2-naphthylsulfonyl)oxime, 2,2,2-trifluoro-1-phenylethanone=O-(2,4,6-trimethylphenylsulfonyl)oxime, 2,2,2-trifluoro-1-(4-methylphenyl)ethanone=O-(10-camphorsulfonyl)oxime, 2,2,2-trifluoro-1-(4-methylphenyl)ethanone=O-(methylsulfonyl)oxime, 2,2,2-trifluoro-1-(2-methylphenyl)ethanone=O-(10-camphorsulfonyl)oxime, 2,2,2-trifluoro-1-(2,4-dimethylphenyl)ethanone=O-(10-camphorsulfonyl)oxime, 2,2,2-trifluoro-1-(2,4-dimethylphenyl)ethanone=O-(1-naphthylsulfonyl)oxime, 2,2,2-trifluoro-1-(2,4-dimethylphenyl)ethanone=O-(2-naphthylsulfonyl)oxime, 2,2,2-trifluoro-1-(2,4,6-trimethylphenyl)ethanone=O-(10-camphorsulfonyl)oxime, 2,2,2-trifluoro-1-(2,4,6-trimethylphenyl)ethanone=O-(1-naphthylsulfonyl)oxime, 2,2,2-trifluoro-1-(2,4,6-trimethylphenyl)ethanone=O-(2-naphthylsulfonyl)oxime, 2,2,2-trifluoro-1-(4-methoxyphenyl)ethanone=O-(methylsulfonyl)oxime, 2,2,2-trifluoro-1-(4-methylthiophenyl)ethanone=O-(methylsulfonyl)oxime, 2,2,2-trifluoro-1-(3,4-dimethoxyphenyl)ethanone=O-(methylsulfonyl)oxime, 2,2,2-trifluoro-1-(4-methoxyphenyl)ethanone=O-(4-methylphenylsulfonyl) oxime, 2,2,2-trifluoro-1-(4-methoxyphenyl)ethanone=O-(4-methoxyphenylsulfonyl)oxime, 2,2,2-trifluoro-1-(4-methoxyphenyl)ethanone=O-(4-dodecylphenylsulfonyl)oxime, 2,2,2-trifluoro-1-(4-methoxyphenyl)ethanone=O-(octylsulfonyl)oxime, 2,2,2-trifluoro-1-(4-thiomethylphenyl)ethanone=O-(4-methoxyphenylsulfonyl)oxime, 2,2,2-trifluoro-1-(4-thiomethylphenyl)ethanone=O-(4-methoxyphenylsulfonyl)oxime, 2,2,2-trifluoro-1-(4-thiomethylphenyl)ethanone=O-(4-dodecylphenylsulfonyl)oxime, 2,2,2-trifluoro-1-(4-thiomethylphenyl)ethanone=O-(octylsulfonyl)oxime, 2,2,2-trifluoro-1-(4-thiomethylphenyl)ethanone=O-(2-naphthylsulfonyl)oxime, 2,2,2-trifluoro-1-(2-methylphenyl)ethanone=O-(methylsulfonyl)oxime, 2,2,2-trifluoro-1-(4-methylphenyl)ethanone=O-(phenylsulfonyl)oxime, 2,2,2-trifluoro-1-(4-chlorophenyl)ethanone=O-(phenylsulfonyl)oxime, 2,2,3,3,4,4-heptafluoro-1-phenylbutanone=O-(10-camphorsulfonyl)oxime, 2,2,2-trifluoro-1-(1-naphthyl)ethanone=O-(methylsulfonyl)oxime, 2,2,2-trifluoro-1-(2-naphthyl)ethanone=O-(methylsulfonyl)oxime, 2,2,2-trifluoro-1-(4-benzylphenyl)ethanone=O-(methylsulfonyl)oxime, 2,2,2-trifluoro-1-(4-(phenyl-1,4-dioxa-buto-1-yl)phenyl)ethanone=O-(methylsulfonyl)oxime, 2,2,2-trifluoro-1-(1-naphthyl)ethanone=O-(propylsulfonyl)oxime, 2,2,2-trifluoro-1-(2-naphthyl)ethanone=O-(propylsulfonyl)oxime, 2,2,2-trifluoro-1-(4-benzylphenyl)ethanone=O-(propylsulfonyl)oxime, 2,2,2-trifluoro-1-(4-methylsulfonylphenyl)ethanone=O-(propylsulfonyl)oxime, 2,2,2-trifluoro-1-(4-methylsulfonyloxyphenyl)ethanone=O-(propylsulfonyl) oxime, 2,2,2-trifluoro-1-(4-methylcarbonyloxyphenyl)ethanone=O-(propylsulfonyl)oxime, 2,2,2-trifluoro-1-(6H,7H-5,8-dioxonaphtho-2-yl)ethanone=O-(propylsulfonyl) oxime, 2,2,2-trifluoro-1-(4-methoxylcarbonylmethoxyphenyl)ethanone=O-(propylsulfonyl)oxime, 2,2,2-trifluoro-1-(4-methoxylcarbonyl)-(4-amino-1-oxa-penta-1-yl)phenyl)ethanone=O-(propylsulfonyl)oxime, 2,2,2-trifluoro-1-(3,5-dimethyl-4-ethoxyphenyl)ethanone=O-(propylsulfonyl) oxime, 2,2,2-trifluoro-1-(4-benzyloxyphenyl)ethanone=O-(propylsulfonyl)oxime, 2,2,2-trifluoro-1-(2-thiophenyl)ethanone=O-(propylsulfonate)oxime, 2,2,2-trifluoro-1-(1-dioxathiophene-2-yl)ethanone=O-(propylsulfonate)oxime, 2,2,2-trifluoro-1-(4-(3-(4-(2,2,2-trifluoro-1-(trifluoromethanesulfonyloxyimino)ethyl)phenoxy)propoxy)phenyl)ethanone=O-(trifluoromethanesulfonyl)oxime, 2,2,2-trifluoro-1-(4-(3-(4-(2,2,2-trifluoro-1-(1-propanesulfonyloxyimino)ethyl)phenoxy)propoxy)phenyl)ethanone=O-(propylsulfonyl)oxime, 2,2,2-trifluoro-1-(4-(3-(4-(2,2,2-trifluoro-1-(1-butanesulfonyloxyimino)ethyl)phenoxy)propoxy)phenyl)ethanone=O-(butylsulfonyl) oxime, 2,2,2-trifluoro-1-(4-(3-(4-(2,2,2-trifluoro-1-(4-(4-methylphenylsulfonyloxy)phenylsulfonyloxyimino)ethyl)phenoxy)propoxy)phenyl)ethanone=O-(4-(4-methylphenylsulfonyloxy)phenylsulfonyloxy)oxime, and 2,2,2-trifluoro-1-(4-(3-(4-(2,2,2-trifluoro-1-(2,5-bis(4- methylphenylsulfonyloxy)benzenesulfonyloxy)phenylsulfonyloxyimino)ethyl)phenoxy)propoxy)phenyl)ethanone=O-(2,5-bis(4-methylphenylsulfonyloxy)benzenesulfonyloxy)phenylsulfonyl)oxime. In addition, the above-mentioned skeletons substituted by the followings may be mentioned; 2-benzoyloxy-1,1,3,3,3-pentafluoropropane sulfonate, 1,1,3,3,3-pentafluoro-2-(4-phenylbenzoyloxy)propane sulfonate, 1,1,3,3,3-pentafluoro-2-pivaloyloxypropane sulfonate, 2-cyclohexanecarbonyloxy-1,1,3,3,3-pentafluoropropane sulfonate, 1,1,3,3,3-pentafluoro-2-furoyloxypropane sulfonate, 2-naphthoyloxy-1,1,3,3,3-pentafluoropropane sulfonate, 2-(4-tert-butylbenzoyloxy)-1,1,3,3,3-pentafluoropropane sulfonate, 2-(1-adamantanecarbonyloxy)-1,1,3,3,3-pentafluoropropane sulfonate, 2-acetyloxy-1,1,3,3,3-pentafluoropropane sulfonate, 1,1,3,3,3-pentafluoro-2-hydroxypropane sulfonate, 1,1,3,3,3-pentafluoro-2-tosyloxypropane sulfonate, 1,1-difluoro-2-tosyloxyethane sulfonate, adamantanemethoxycarbonyl difluoromethane sulfonate, 1-(3-hydroxymethyladamantane)methoxycarbonyl difluoromethane sulfonate, methoxycarbonyl difluoromethane sulfonate, 1-(hexahydro-2-oxo-3,5-methano-2H-cyclopenta[b]furane-6-yloxycarbonyl)difluoromethane sulfonate, and 4-oxo-1-adamantyloxycarbonyl difluoromethane sulfonate.

Further, an oxime sulfonate represented by the following formula (Ox-1) may be mentioned:

(Ox-1)

wherein $R^{401}$ represents a substituted or an unsubstituted haloalkylsulfonyl group having 1 to 10 carbon atoms or a halobenzene sulfonyl group; $R^{402}$ represents a haloalkyl group having 1 to 11 carbon atoms; and $Ar^{401}$ represents a substituted or an unsubstituted aromatic group or a heteroaromatic group.

Specific examples include 2-(2,2,3,3,4,4,5,5-octafluoro-1-(nonafluorobutylsulfonyloxyimino)pentyl)fluorene, 2-(2,2,3,3,4,4-pentafluoro-1-(nonafluorobutylsulfonyloxyimino)butyl)fluorene, 2-(2,2,3,3,4,4,5,5,6,6-decafluoro-1-(nonafluorobutylsulfonyloxyimino)hexyl)fluorene, 2-(2,2,3,3,4,4,5,5-octafluoro-1-(nonafluorobutylsulfonyloxyimino)pentyl)-4-biphenyl, 2-(2,2,3,3,4,4-pentafluoro-1-(nonafluorobutylsulfonyloxyimino)butyl)-4-biphenyl, and 2-(2,2,3,3,4,4,5,5,6,6-decafluoro-1-(nonafluorobutylsulfonyloxyimino)hexyl)-4-biphenyl. In addition, the above-mentioned skeletons substituted by the followings may be mentioned; 2-benzoyloxy-1,1,3,3,3-pentafluoropropane sulfonate, 1,1,3,3,3-pentafluoro-2-(4-phenylbenzoyloxy)propane sulfonate, 1,1,3,3,3-pentafluoro-2-pivaloyloxypropane sulfonate, 2-cyclohexanecarbonyloxy-1,1,3,3,3-pentafluoropropane sulfonate, 1,1,3,3,3-pentafluoro-2-furoyloxypropane sulfonate, 2-naphthoyloxy-1,1,3,3,3-pentafluoropropane sulfonate, 2-(4-tert-butylbenzoyloxy)-1,1,3,3,3-pentafluoropropane sulfonate, 2-(1-adamantanecarbonyloxy)-1,1,3,3,3-pentafluoropropane sulfonate, 2-acetyloxy-1,1,3,3,3-pentafluoropropane sulfonate, 1,1,3,3,3-pentafluoro-2-hydroxypropane sulfonate, 1,1,3,3,3-pentafluoro-2-tosyloxypropane sulfonate, 1,1-difluoro-2-tosyloxyethane sulfonate, adamantanemethoxycarbonyl difluoromethane sulfonate, 1-(3-hydroxymethyladamantane)methoxycarbonyl difluoromethane sulfonate, methoxycarbonyl difluoromethane sulfonate, 1-(hexahydro-2-oxo-3,5-methano-2H-cyclopenta[b]furane-6-yloxycarbonyl)difluoromethane sulfonate, and 4-oxo-1-adamantyloxycarbonyl difluoromethane sulfonate.

Examples of the oxime sulfonate type using a substituted acetonitrile derivative include α-(p-toleuenesulfonyloxyimino)-phenyl acetonitrile, α-(p-chlorobenzenesulfonyloxyimino)-phenyl acetonitrile, α-(4-nitrobenzenesulfonyloxyimino)-phenyl acetonitrile, α-(4-nitro-2-trifluoromethylbenzenesulfonyloxyimino)-phenyl acetonitrile, α-(benzenesulfonyloxyimino)-4-chlorophenyl acetonitrile, α-(benzenesulfonyloxyimino)-2,4-dichlorophenyl acetonitrile, α-(benzenesulfonyloxyimino)-2,6-dichlorophenyl acetonitrile, α-(benzenesulfonyloxyimino)-4-methoxyphenyl acetonitrile, α-(2-chlorobenzenesulfonyloxyimino)-4-methoxyphenyl acetonitrile, α-(benzenesulfonyloxyimino)-2-thienyl acetonitrile, α-(4-dodecylbenzenesulfonyloxyimino)-phenyl acetonitrile, α-((4-toluenesulfonyloxyimino)-4-methoxyphenyl)acetonitrile, α-((dodecylbenzenesulfonyloxyimino)-4-methoxyphenyl)acetonitrile, α-(tosyloxyimino)-3-thienyl acetonitrile, α-(methylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, and α-(n-butylsulfonyloxyimino)-1-cyclohexenyl acetonitrile. In addition, the above-mentioned skeletons substituted by the followings may be mentioned; 2-benzoyloxy-1,1,3,3,3-pentafluoropropane sulfonate, 1,1,3,3,3-pentafluoro-2-(4-phenylbenzoyloxy)propane sulfonate, 1,1,3,3,3-pentafluoro-2-pivaloyloxypropane sulfonate, 2-cyclohexanecarbonyloxy-1,1,3,3,3-pentafluoropropane sulfonate, 1,1,3,3,3-pentafluoro-2-furoyloxypropane sulfonate, 2-naphthoyloxy-1,1,3,3,3-pentafluoropropane sulfonate, 2-(4-tert-butylbenzoyloxy)-1,1,3,3,3-pentafluoropropane sulfonate, 2-(1-adamantanecarbonyloxy)-1,1,3,3,3-pentafluoropropane sulfonate, 2-acetyloxy-1,1,3,3,3-pentafluoropropane sulfonate, 1,1,3,3,3-pentafluoro-2-hydroxypropane sulfonate, 1,1,3,3,3-pentafluoro-2-tosyloxypropane sulfonate, 1,1-difluoro-2-tosyloxyethane sulfonate, adamantanemethoxycarbonyl difluoromethane sulfonate, 1-(3-hydroxymethyladamantane)methoxycarbonyl difluoromethane sulfonate, methoxycarbonyl difluoromethane sulfonate, 1-(hexahydro-2-oxo-3,5-methano-2H-cyclopenta[b]furane-6-yloxycarbonyl)difluoromethane sulfonate, and 4-oxo-1-adamantyloxycarbonyl difluoromethane sulfonate.

Examples of the bisoxime sulfonate include bis(α-(p-toluenesulfonyloxy)imino)-p-phenylene diacetonitrile, bis(α-(benzenesulfonyloxy)imino)-p-phenylene diacetonitrile, bis(α-(methanesulfonyloxy)imino)-p-phenylene diacetonitrile, bis(α-(butanesulfonyloxy)imino)-p-phenylene diacetonitrile, bis(α-(10-camphorsulfonyloxy)imino)-p-phenylene diacetonitrile, bis(α-(trifluoromethanesulfonyloxy)imino)-p-phenylene diacetonitrile, bis(α-(4-methoxybenzenesulfonyloxy)imino)-p-phenylene diacetonitrile, bis(α-(p-toluenesulfonyloxy)imino)-m-phenylene diacetonitrile, bis(α-(benzenesulfonyloxy)imino)-m-phenylene diacetonitrile, bis(α-(methanesulfonyloxy)imino)-m-phenylene diacetonitrile, bis(α-(butanesulfonyloxy)imino)-m-phenylene diacetonitrile, bis(α-(10-camphorsulfonyloxy)imino)-m-phenylene diacetonitrile, bis(α-(trifluoromethanesulfonyloxy)imino)-m-phenylene diacetonitrile, and bis(α-(4-methoxybenzenesulfonyloxy)imino)-m-phenylene diacetonitrile. In addition, the above-mentioned skeletons substituted by the followings may be mentioned; 2-benzoyloxy-1,1,3,3,3-pentafluoropropane sulfonate, 1,1,3,3,3-pentafluoro-2-(4-phenylbenzoyloxy)propane sulfonate, 1,1,3,3,3-pentafluoro-2-pivaloyloxypropane sulfonate, 2-cyclohexanecarbonyloxy-1,1,3,3,3-pentafluoropropane sulfonate, 1,1,3,3,3-pentafluoro-2-furoyloxypropane sulfonate, 2-naphthoyloxy-1,1,3,3,3-pentafluoropropane sulfonate, 2-(4-tert-butylbenzoyloxy)-1,1,3,3,3-pentafluoropropane sulfonate, 2-(1-adamantanecarbonyloxy)-1,1,3,3,3-pentafluoropropane sulfonate, 2-acetyloxy-1,1,3,3,3-pentafluoropropane sulfonate, 1,1,3,3,3-pentafluoro-2-hydroxypropane sulfonate, 1,1,3,3,3-pentafluoro-2-tosyloxypropane sulfonate, 1,1-difluoro-2-tosyloxyethane sulfonate, adamantanemethoxycarbonyl difluoromethane sulfonate, 1-(3-hydroxymethyladamantane)methoxycarbonyl difluoromethane sulfonate, methoxycarbonyl difluoromethane sulfonate, 1-(hexahydro-2-oxo-3,5-methano-2H-cyclopenta[b]furane-6-yloxycarbonyl)difluoromethane sulfonate, and 4-oxo-1-adamantyloxycarbonyl difluoromethane sulfonate. Among the compounds mentioned above, a sulfonium salt, a bissulfonyl diazomethane, an N-sulfonyloxy imide, and an oxime-O-sulfonate have preferable sensitivity and stability.

Among them, more preferable specific examples of the sulfonium salts include triphenyl sulfonium=p-toluene sulfonate, triphenyl sulfonium=camphor sulfonate, triphenyl sulfonium=pentafluorobenzene sulfonate, triphenyl sulfonium=nonafluorobutane sulfonate, triphenyl sulfonium=4-(p-toluenesulfonyloxy)benzene sulfonate, triphenyl sulfonium=2,4,6-triisopropylbenzene sulfonate, 4-tert-butoxyphenyl diphenyl sulfonium=p-toluene sulfonate, 4-tert-butoxyphenyl diphenyl sulfonium=camphor sulfonate, 4-tert-butoxyphenyl diphenyl sulfonium=4-(p-toluenesulfonyloxy)benzene sulfonate, 4-tert-butylphenyl diphenyl sulfonium=camphor sulfonate, 4-tert-butylphenyl diphenyl sulfonium=2,4,6-triisopropylbenzene sulfonate, tris(4-methylphenyl)sulfonium=camphor sulfonate, tris(4-tert-butylphenyl)sulfonium=camphor sulfonate, 10-phenylphenoxathiinium=2,4,6-triisopropylbenzene sulfonate, triphenyl sulfonium=trifluoromethane sulfonate, triphenyl sulfonium=pentafluoroethane sulfonate, triphenyl sulfonium=heptafluoropropane sulfonate, triphenyl sulfonium=nonafluorobutane sulfonate, triphenyl sulfonium=tridecafluorohexane sulfonate, triphenyl sulfonium=heptadecafluorooctane sulfonate, triphenyl sulfonium=perfluoro(4-ethylcyclohexane) sulfonate, 4-methylphenyl diphenyl sulfonium=nonafluorobutane sulfonate, 2-oxo-2-phenylethylthiacyclopentanium=nonafluorobutane sulfonate, 4-tert-butylphenyl diphenyl sulfonium=nonafluorobutane sulfonate, 4-tert-butylphenyl diphenyl sulfonium=perfluoro(4-ethylcyclohexane) sulfonate, 4-tert-butylphenyl diphenyl sulfonium=heptafluorooctane sulfonate, triphenyl sulfonium=1,1-difluoro-2-naphthylethane sulfonate, triphenyl sulfonium=1,1,2,2-tetrafluoro-2-(norbornane-2-yl)ethane sulfonate, triphenyl sulfonium=2-benzoyloxy-1,1,3,3,3-pentafluoropropane sulfonate, triphenyl sulfonium=1,1,3,3,3-pentafluoro-2-(pivaloyloxy)propane sulfonate, triphenyl sulfonium=2-(cyclohexanecarbonyloxy)-1,1,3,3,3-pentafluoropropane sulfonate, triphenyl sulfonium=2-(2-naphthoyloxy)-1,1,3,3,3-pentafluoropropane sulfonate, triphenyl sulfonium=2-(1-adamantanecarbonyloxy)-1,1,3,3,3-pentafluoropropane sulfonate, triphenyl sulfonium=2-hydroxy-1,1,3,3,3-pentafluoropropane sulfonate, triphenyl sulfonium=adamantanemethoxycarbonyl difluoromethane sulfonate, triphenyl sulfonium=1-(3-hydroxymethyladamantane)methoxycarbonyl difluoromethane sulfonate, triphenyl sulfonium=methoxycarbonyl difluoromethane sulfonate, 4-tert-butylphenyl diphenyl sulfonium=2-benzoyloxy-1,1,3,3,3-pentafluoropropane sulfonate, 4-tert-butylphenyl diphenyl sulfonium=1,1,3,3,3-pentafluoro-2-(pivaloyloxy)propane sulfonate, 4-tert-butylphenyl diphenyl sulfonium=2-(cyclohexanecarbonyloxy)-1,1,3,3,3-pentafluoropropane sulfonate, 4-tert-butylphenyl diphenyl sulfonium=2-(2-naphthoyloxy)-1,1,3,3,3-pentafluoropropane sulfonate, 4-tert-butylphenyl diphenyl sulfonium=2-(1-adamantanecarbonyloxy)-1,1,3,3,3-pentafluoropropane sulfonate, 4-tert-butylphenyl diphenyl sulfonium=2-hydroxy-1,1,3,3,3-pentafluoropropane sulfonate, 4-tert-butylphenyl diphenyl sulfonium=adamantanemethoxycarbonyl difluoromethane sulfonate, 4-tert-butylphenyl diphenyl sulfonium=1-(3-hydroxymethyladamantane)methoxycarbonyl difluoromethane sulfonate, and 4-tert-butylphenyl diphenyl sulfonium=methoxycarbonyl difluoromethane sulfonate.

Specific examples of the bissulfonyl diazomethane include bis(tert-butylsulfonyl)diazomethane, bis(cyclohexylsulfonyl)diazomethane, bis(2,4-dimethylphenylsulfonyl)diazomethane, bis(4-n-hexyloxyphenylsulfonyl)diazomethane, bis(2-methyl-4-n-hexyloxyphenylsulfonyl)diazomethane, bis(2,5-dimethyl-4-n-hexyloxyphenylsulfonyl)diazomethane, bis(3,5-dimethyl-4-n-hexyloxyphenylsulfonyl)diazomethane, bis(2-methyl-5-isopropyl-4-n-hexyloxy)phenylsulfonyl diazomethane, and bis(4-tert-butylphenylsulfonyl)diazomethane.

Specific examples of the N-sulfonyl oxyimide include N-camphorsulfonyloxy-5-norbornene-2,3-dicarboxylic imide, N-p-toluenesulfonyloxy-5-norbornene-2,3-dicarboxylic imide, (5-(10-camphorsulfonyl)oxyimino-5H-thiophene-2-iridene)(2-methylphenyl)acetonitrile, and (5-(p-toluenesulfonyl)oxyimino-5H-thiophene-2-iridene)(2-methylphenyl)acetonitrile.

Specific examples of the oxime-O-sulfonate include 2-oxo-2-phenylethylthiacyclopentanium=2-benzoyloxy-1,1,3,3,3-pentafluoropropane sulfonate, 2-oxo-2-phenylethylthiacyclopentanium=2-cyclohexanecarbonyloxy-1,1,3,3,3-pentafluoropropane sulfonate, triphenyl sulfonium=perfluoro(1,3-propylenebissulfonyl)imide, triphenyl sulfonium=bis(pentafluoroethylsulfonyl)imide, 2-(2,2,3,3,4,4,5,5-octafluoro-1-(nonafluorobutylsulfonyloxyimino)pentyl)fluorene, 2-(2,2,3,3,4,4-pentafluoro-1-(nonafluorobutylsulfonyloxyimino)butyl)fluorene, 2-(2,2,3,3,4,4,5,5,6,6-decafluoro-1-(nonafluorobutylsulfonyloxyimino)hexyl)fluorene, 2-(2,2,3,3,4,4,5,5-octafluoro-1-(2-(cyclohexanecarbonyloxy)-1,1,3,3,3-pentafluoropropanesulfonyloxyimino)pentyl)fluorene, 2-(2,2,3,3,4,4-pentafluoro-1-(2-(cyclohexanecarbonyloxy)-1,1,3,3,3-pentafluoropropanesulfonyloxyimino)butyl)fluorene and 2-(2,2,3,3,4,4,5,5,6,6-decafluoro-1-(nonafluorobutylsulfonyloxyimino)hexyl)fluorene.

The amount of the photo acid-generator in a chemically-amplified resist composition of the present invention is not particularly restricted, but it is 0.1 to 15 parts by weight, and preferably 2.0 to 10.0 parts by weight, relative to 100 parts by weight of a base polymer. When the amount of the photo acid-generator is too much, there are risks of deterioration of a resolution power and formation of foreign materials during development and resist removal. These photo acid-generators may be used singly or as a mixture of two or more kinds. Further, by using an photo acid-generator having low transmittance at a light-exposure wavelength, transmittance in a resist film may be controlled by its addition amount.

A resist composition used in the present invention may contain a basic compound. A basic compound capable of suppressing the diffusion rate of an acid generated from a photo acid-generator into a resist film is suitable. By blending a basic compound like this, the diffusion rate of an acid in a resist film is suppressed thereby leading to increase in the resolution power, to suppress a sensitivity change after a light-exposure, to reduce dependency on a substrate and an environment, and to improve an exposure latitude, a pattern profile, and the like.

The basic compound may be exemplified by a primary, a secondary, and a tertiary aliphatic amine, a mixed amine, an aromatic amine, a heterocyclic amine, a nitrogen-containing amine compound having a carboxy group, a nitrogen-containing amine compound having a sulfonyl group, a nitrogen-containing amine compound having a hydroxyl group, a nitrogen-containing amine compound having a hydroxyphenyl group, an alcoholic nitrogen-containing compound, an amide derivative, an imide derivative, and the like.

Specific examples of the primary aliphatic amine include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Specific examples of the secondary aliphatic amine include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylene diamine, N,N-dimethylethylene diamine, and N,N-dimethyltetraethylene pentamine. Specific examples of the tertiary aliphatic amine include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylene diamine, N,N,N',N'-tetramethylethylene diamine, and N,N,N',N'-tetramethyltetraethylene pentamine.

The mixed amine may be exemplified by dimethylethylamine, methylethylpropylamine, benzylamine, phenethylamine, benzyldimethylamine, and the like. Specific examples of the aromatic amine and the heterocyclic amine include an aniline derivative (such as aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, a pyrrole derivative (such as pyrrole, 2H-pyrrole, 1-methylpyrrole, 2,4-dimethylpyrrole, 2,5-dimethylpyrrole, and N-methylpyrrole), a oxazole derivative (such as oxazole and isooxazole), a thiazole derivative (such as thiazole and isothiazole), an imidazole derivative (such as imidazole, 4-methylimidazole, and 4-methyl-2-phenylimidazole), a pyrazole derivative, a furazan derivative, a pyrroline derivative (such as pyrroline and 2-methyl-1-pyrroline), a pyrrolidine derivative (such as pyrrolidine, N-methylpyrrolidine, pyrrolidinone, and N-methylpyrrolidone), an imidazoline derivative, an imidazolidine derivative, a pyridine derivative (such as pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), a pyridazine derivative, a pyrimidine derivative, a pyrazine derivative, a pirazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (such as quinoline and 3-quinolinecarbonitrile), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a quanosine derivative, an uracil derivative, and an uridine derivative.

Further, examples of the nitrogen-containing compound having a carboxy group include amino benzoic acid, indole carboxylic acid, and an amino acid derivative (such as nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, and methoxy alanine). Examples of the nitrogen-containing compound having a sulfonyl group include 3-pyridinesulfonic acid and pyridinium p-toluenesulfonate. Examples of the nitrogen-containing compound having a hydroxyl group, the nitrogen-containing compound having a hydroxyphenyl group, and the alcoholic nitrogen-containing compound include 2-hydroxy pyridine, amino cresol, 2,4-quinoline diol, 3-indole methanol hydrate, monoethanol amine, diethanol amine, triethanol amine, N-ethyl diethanol amine, N,N-diethyl ethanol amine, triisopropanol amine, 2,2'-imino diethanol, 2-amino ethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine, ethanol, N-(2-hydroxyethyl)phthalimide, and N-(2-hydroxyethyl)isonicotine amide. Examples of the amide derivative include formamide, N-methyl formamide, N,N-dimethyl formamide, acetamide, N-methyl acetamide, N,N-dimethyl acetamide, propione amide, and benzamide. Examples of the imide derivative include phthalimide, succine imide, and maleimide.

Further, a compound selected from the basic compounds represented by the following general formula (B)-1 may be added singly, or in a combination of one or two or more kinds.

$$N(X')_n(Y')_{3-n} \qquad \text{(B)-1}$$

In the formula, n represents 1, 2, and 3. The side-chain X' may be the same or different, and represented by the following general formulae (X')-1 to (X')-3:

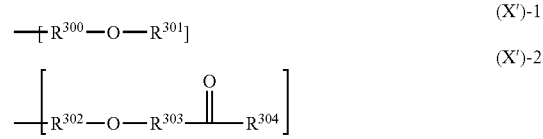

-continued

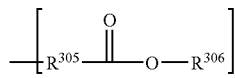

(X')-3

The side chain Y' may be the same or different, representing a hydrogen atom, a linear, a branched, or a cyclic alkyl group having 1 to 20 carbon atoms, and optionally containing an ether group or a hydroxyl group. Further, X' may form a ring by connecting with each other. Here, each of $R^{300}$, $R^{302}$, and $R^{305}$ represents a linear or a branched alkylene group having 1 to 4 carbon atoms; each of $R^{301}$ and $R^{304}$ represents a hydrogen atom, a linear, a branched, or a cyclic alkyl group having 1 to 20 carbon atoms, and optionally containing one or more kinds of groups selected from a hydroxyl group, an ether group, an ester-group, and a lactone ring; $R^{303}$ represents a single bond, a linear or a branched alkylene group having 1 to 4 carbon atoms; and $R^{306}$ represents a linear, a branched, or a cyclic alkyl group having 1 to 20 carbon atoms, and optionally containing one or more kinds of groups selected from a hydroxyl group, an ether group, an ester group, and a lactone ring.

Specific examples of the compound represented by the general formula (B)-1 include tris(2-methoxymethoxyethyl) amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris{2-[2-(2-hydroxyethoxy)ethoxy]ethyl}amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl) amine, N,N-bis(2-acetoxyethyl) 2-(acetoxyacetoxy)ethyl amine, tris(2-methoxycarbonyloxyethyl)amine, tris(2-tert-butoxycarbonyloxyethyl)amine, tris[2-(2-oxopropoxy) ethyl]amine, tris[2-(methoxycarbonylmethyl)oxyethyl] amine, tris[2-(tert-butoxycarbonylmethyloxy)ethyl]amine, tris[2-(cyclohexyloxycarbonylmethyloxy)ethyl]amine, tris (2-methoxycarbonylethyl)amine, tris(2-ethoxycarbonylethyl)amine, N,N-bis(2-hydroxyethyl) 2-(methoxycarbonyl) ethyl amine, N,N-bis(2-acetoxyethyl) 2-(methoxycarbonyl) ethyl amine, N,N-bis(2-hydroxyethyl) 2-(ethoxycarbonyl) ethyl amine, N,N-bis(2-acetoxyethyl) 2-(ethoxycarbonyl) ethyl amine, N,N-bis(2-hydroxyethyl) 2-(2-methoxyethoxycarbonyl)ethyl amine, N,N-bis(2-acetoxyethyl) 2-(2-methoxyethoxycarbonyl)ethyl amine, N,N-bis(2-hydroxyethyl) 2-(2-hydroxyethoxycarbonyl) ethyl amine, N,N-bis(2-acetoxyethyl) 2-(2-acetoxyethoxycarbonyl)ethyl amine, N,N-bis(2-hydroxyethyl) 2-[(methoxycarbonyl)methoxycarbonyl]ethyl amine, N,N-bis(2-acetoxyethyl) 2-[(methoxycarbonyl)methoxycarbonyl]ethyl amine, N,N-bis(2-hydroxyethyl) 2-(2-oxopropoxycarbonyl) ethyl amine, N,N-bis(2-acetoxyethyl) 2-(2-oxopropoxycarbonyl)ethyl amine, N,N-bis(2-hydroxyethyl) 2-(tetrahydrofurfuryloxycarbonyl)ethyl amine, N,N-bis(2-acetoxyethyl) 2-(tetrahydrofurfuryloxycarbonyl)ethyl amine, N,N-bis(2-hydroxyethyl) 2-[(2-oxotetrahydrofurane-3-yl)oxycarbonyl] ethyl amine, N,N-bis(2-acetoxyethyl) 2-[(2-oxotetrahydrofurane-3-yl)oxycarbonyl]ethyl amine, N,N-bis(2-hydroxyethyl) 2-(4-hydroxybutoxycarbonyl)ethyl amine, N,N-bis(2-formyloxyethyl) 2-(4-formyloxybutoxycarbonyl) ethyl amine, N,N-bis(2-formyloxyethyl) 2-(2-formyloxyethoxycarbonyl)ethyl amine, N,N-bis(2-methoxyethyl) 2-(methoxycarbonyl)ethyl amine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis [2-(methoxycarbonyl)ethyl]amine, N-(3-acetoxy-1-propyl) bis[2-(methoxycarbonyl)ethyl]amine, N-(2-methoxyethyl) bis[2-(methoxycarbonyl)ethyl]amine, N-butyl bis[2-(methoxycarbonyl)ethyl]amine, N-butyl bis[2-(2-methoxyethoxycarbonyl)ethyl]amine, N-methyl bis(2-acetoxyethyl)amine, N-ethyl bis(2-acetoxyethyl)amine, N-methyl bis(2-pivaloyloxyethyl)amine, N-ethyl bis[2-(methoxycarbonyloxy)ethyl]amine, N-ethyl bis[2-(tert-butoxycarbonyloxy)ethyl]amine, tris(methoxycarbonylmethyl) amine, tris(ethoxycarbonylmethyl)amine, N-butyl bis (methoxycarbonylmethyl)amine, N-hexyl bis (methoxycarbonylmethyl)amine, and β-(diethylamino)-δ-valerolactone, but the compound is not restricted to them.

A basic compound having an amine oxide structure in which a nitrogen atom in the above examples is oxidized may be used as the basic component. Specific examples of it include tris(2-(methoxymethoxy)ethyl)amine=oxide, 2,2',2''-nitrirotriethylpropionate N-oxide, and N-2-((2-methoxyethoxy)methoxyethylmorpholine N-oxide.

These basic compounds may be used singly or in a combination of two or more kinds. Its blending amount is 0 to 2 parts by weight, and preferably 0.01 to 2 parts by weight in particular, relative to 100 parts by weight of a solid component in a resist composition. When the amount is more than 3 parts by weight, there is a risk of too lowering a sensitivity.

A resist composition of the present invention may contain a surfactant to obtain a highly smooth resist film when coated. Any publicly known surfactant may be added, and the examples of it include a polyoxyethylene alkyl ether such as polyoxyethylene lauryl ether, polyoxyethylene stearyl ether, polyoxyethylene cetyl ether, and polyoxyethylene olein ether; a polyoxyethylene alkylaryl ether such as polyoxyethylene octylphenol ether and polyoxyethylene nonylphenol ether; a polyoxyethylene polyoxypropylene block copolymer; a sorbitane fatty acid ester such as sorbitane monolaurate, sorbitane monopalmitate, and sorbitane monostearate; a nonionic surfactant of a polyoxyethylene sorbitane fatty acid ester such as polyoxyethylene sorbitane monolaurate, polyoxyethylene sorbitane monopalmitate, polyoxyethylene sorbitane monostearate, polyethylene sorbitane trioleate, and polyoxyethylene sorbitane tristearate; a fluorinated surfactant such as F-Top EF301, EF303, and EF352 (manufactured by Tochem Products Co., Ltd.), Megafac F171, F172, and F173 (manufactured by Dainippon Ink & Chemicals, Inc.), Flolade FC430 and FC431 (manufactured by Sumitomo 3M Ltd.), Asahi Guard AG710, Surflon S-381, S-382, SC101, SC102, SC103, SC104, SC105, SC106, Surfinol E1004, KH-10, KH-20, KH-30, and KH-40 (manufactured by Asahi Glass Co., Ltd.); an organosiloxane polymer such as KP-341, X-70-092, and X-70-093 (manufactured by Shin-Etsu Chemical Co., Ltd.); and an acrylic acid or a methacrylic acid polymer such as Polyflow No. 75 and No. 95 (manufactured by Kyoeisha Yushikagaku Kogyo K. K.). Among them, FC430, Surflon S-381, Surfinol E1004, KH-20, and KH-30 are preferable. These may be used singly or in a combination of two or more kinds.

The amount of a surfactant to be added in a chemically-amplified positive resist composition of the present invention is 2 parts or less, and preferably 1 part or less, relative to 100 parts by weight of a solid component in a resist composition.

In manufacturing of various kinds of integrated circuits and photo masks by using a chemically-amplified positive resist composition as mentioned above in the present invention, a lithography technology known to those skilled in the art may be used. For example, a chemically-amplified positive resist composition of the present invention is coated on a substrate for manufacturing of an integrated circuit and a photo mask blank (the outermost surface is formed of Si, $SiO_2$, SiN, SiON, TiN, WSi, BPSG, SOG, an organic anti-reflection layer, a chrome compound, a molybdenum-silicon compound, and the like) by an arbitrary method such as a spin coat, a roll coat, a flow coat, a dip coat, a spray coat, a doctor coat, and the like with a film thickness of 0.1 to 2.0 micrometers, and then pre-baked on a hot plate at 60 to 150° C. for 1 to 10 minutes, and preferably at 80 to 120° C. for 1 to 5 minutes.

Then, an intended pattern is obtained by a light-exposure through a prescribed mask using a light source selected from a UV beam, a deep-UV beam, an electronic beam, an excimer laser, a γ-ray, a synchrotron radiation beam, and the like, preferably a light with a wavelength of 300 nanometers or less. The exposure dose is about 1 $mJ/cm^2$ to about 200 $mJ/cm^2$, and preferably about 10 $mJ/cm^2$ to about 100 $mJ/cm^2$. On a hot plate, post-exposure bake (PEB) is done at 60 to 150° C. for 1 to 5 minutes, and preferably at 80 to 120° C. for 1 to 3 minutes.

Then, the development is made using a developer of an aqueous alkaline solution, preferably tetramethyl ammonium hydroxide (TMAH) and the like, with a concentration of 0.1 to 5%, more preferably 2 to 3%, by a conventional techniques such as a dip method, a puddle method, and a spray method, for 0.1 to 3 minutes, preferably for 0.5 to 2 minutes, to form an intended pattern on a substrate. A resist composition of the present invention is most suitable for fine patterning by a high energy beam, in particular, a KrF excimer laser beam, an electron beam, a soft X-ray, an X-ray, a γ-ray, and a synchrotron radiation beam.

When a resist pattern is formed on a photo mask blank to produce a photo mask, a resist pattern with a high resolution and a small line edge roughness may be obtained by a method as mentioned above. Accordingly, the present invention is suitably used to produce a photo mask for manufacturing a semiconductor with a pattern rule of 65 nanometers or less, in particular, a pattern rule of 45 nanometers or less.

Any publicly known method may be used for processing of a photo mask blank using an above-mentioned resist pattern as an etching mask, but, in general, a dry etching of an oxygen-containing chlorine-type is used when the outermost surface is a chrome compound, and a fluorine-type dry etching is used when the outermost surface is formed of a transition metal-a silicon compound.

EXAMPLES

In the following, the present invention will be explained specifically by using Syntheses Examples, Examples, and Comparative Examples, but the present invention is no restricted to the Examples shown below.
Measurement of Polymer Molecular Weight Molecular weights of polymers are measured by using a gel permeation chromatography with a HLC-8120GPC (manufactured by Tosoh Corp.) in terms of a polystyrene standard sample.

Synthesis Example 1

Into a 3-liter flask were charged 407.5 g of acetoxystyrene, 42.5 g of acenaphthylene, and 1,275 g of toluene as a solvent. The flask was cooled to −70° C. under a nitrogen atmosphere, and the procedure of a deaeration under vacuum followed by a nitrogen flow was repeated three times. After heated to a room temperature, 34.7 g of 2,2'-azobis(2,4-dimethylvaleronitrile (V-65, manufactured by Wako Pure Chemical Industries, Ltd.) was added as a polymerization initiator. After the temperature was raised to 55° C., the reaction was carried out for 40 hours. A mixed solution of 970 g of methanol and 180 g of water was poured dropwise into the reaction solution with agitation, and after 30 minutes, a lower layer (polymer layer) was concentrated under reduced pressure, and then redissolved into 0.45 liter of methanol and 0.54 liter of tetrahydrofurane. It was added by 160 g of triethylamine and 30 g of water, and then the deprotection reaction was carried out by heating at 60° C. for 40 hours. The deprotected reaction solution was concentrated under reduced pressure, dissolved by adding 548 g of methanol and 112 g of acetone, and then added by 990 g of hexane dropwise with agitation. After 30 minutes, a lower layer (polymer layer) was added by 300 g of tetrahydrofurane, and then by 1,030 g of hexane dropwise with agitation. After 30 minutes, a lower layer (polymer layer) was concentrated under reduced pressure, neutralized by 82 g of acetic acid, concentrated, dissolved into 0.3 liter of acetone, and then poured into 10 liters of water. The precipitated solid was filtered and dried to obtain 280 g of a white polymer. A $^{13}$C-NMR, a $^1$H-NMR, and a GPC of the polymer thus obtained were measured to obtain the following analysis results.
Copolymer Composition Ratio:
  Hydroxystyrene:acenaphtylene=89.3:10.7
  Weight-average molecular weight (Mw):5,000
  Molecular weight distribution (Mw/Mn):1.63
This polymer is designated as (poly-1).

Synthesis Example 2

Into a 3-liter flask were charged 403.2 g of acetoxystyrene, 46.8 g of acenaphthylene, and 1,800 g of toluene as a solvent. The flask was cooled to −70° C. under a nitrogen atmosphere, and the procedure of a deaeration under vacuum followed by a nitrogen flow was repeated three times. After heated to a room temperature, 34.7 g of 2,2'-azobis(2,4-dimethylvaleronitrile (V-65, manufactured by Wako Pure Chemical Industries, Ltd.) was added as a polymerization initiator. After the temperature was raised to 55° C., the reaction was carried out for 40 hours. A mixed solution of 1,600 g of methanol and 370 g of water was poured dropwise into the reaction solution with agitation, and after 30 minutes, a lower layer (polymer layer) was concentrated under reduced pressure, and then redissolved into 0.48 liter of methanol and 0.54 liter of tetrahydrofurane. It was added by 160 g of triethylamine and 30 g of water, and then the deprotection reaction was carried out by heating at 60° C. for 40 hours. The deprotected reaction solution was concentrated under reduced pressure, dissolved by adding 548 g of methanol and 112 g of acetone, and then added by 990 g of hexane dropwise with agitation. After 30 minutes, a lower layer (polymer layer) was added by 225 g of tetrahydrofurane, and then by 1,030 g of hexane dropwise with agitation. After 30 minutes, a lower layer (polymer layer) was concentrated under reduced pressure, neutralized by 82 g of acetic acid, concentrated, dissolved into 0.3 liter of acetone, and then poured into 10 liters of water in a similar manner to those as mentioned above. The precipitated solid was filtered and dried to obtain 285 g of a white polymer. A $^{13}$C-NMR, a $^1$H-NMR, and a GPC of the polymer thus obtained were measured to obtain the following analysis results.

Copolymer Composition Ratio:
    Hydroxystyrene:acenaphtylene=87.6:12.4
    Weight-average molecular weight (Mw):4,000
    Molecular weight distribution (Mw/Mn):1.62
This polymer is designated as (poly-2).

Synthesis Example 3

Into a 1-liter flask were charged 315.8 g of acetoxystyrene, 134.6 g of indene, and 675 g of toluene as a solvent. The flask was cooled to −70° C. under a nitrogen atmosphere, and the procedure of a deaeration under vacuum followed by a nitrogen flow was repeated three times. After heated to a room temperature, 38.5 g of 2,2'-azobis(2,4-dimethylvaleronitrile (V-65, manufactured by Wako Pure Chemical Industries, Ltd.) was added as a polymerization initiator. After the temperature was raised to 50° C., the reaction was carried out for 40 hours. A mixed solution of 968 g of methanol and 120 g of water was poured dropwise into the reaction solution with agitation, and after 30 minutes, a lower layer (polymer layer) was concentrated under reduced pressure, and then redissolved into 0.48 liter of methanol and 0.54 liter of tetrahydrofurane. It was added by 160 g of triethylamine and 30 g of water, and then the deprotection reaction was carried out by heating at 60° C. for 40 hours. The deprotected reaction solution was concentrated under reduced pressure, dissolved by adding 548 g of methanol and 112 g of acetone, and then added by 990 g of hexane dropwise with agitation. After 30 minutes, a lower layer (polymer layer) was added by 375 g of tetrahydrofurane, and then by 1,030 g of hexane dropwise with agitation. After 30 minutes, a lower layer (polymer layer) was concentrated under reduced pressure, neutralized by 82 g of acetic acid, concentrated, dissolved into 0.3 liter of acetone, and then poured into 10 liters of water in a similar manner to those as mentioned above. The precipitated solid was filtered and dried to obtain 170 g of a white polymer. A $^{13}$C-NMR, a $^{1}$H-NMR, and a GPC of the polymer thus obtained were measured to obtain the following analysis results.
Copolymer Composition Ratio:
    Hydroxystyrene:indene=89.1:10.9
    Weight-average molecular weight (Mw):4,100
    Molecular weight distribution (Mw/Mn):1.61
This polymer is designated as (poly-3).

Synthesis Example 4

Into a 3-liter flask were charged 407.5 g of acetoxystyrene, 42.5 g of acenaphthylene, and 950 g of toluene as a solvent. The flask was cooled to −70° C. under a nitrogen atmosphere, and the procedure of a deaeration under vacuum followed by a nitrogen flow was repeated three times. After heated to a room temperature, 22.9 g of AIBN was added as a polymerization initiator. After the temperature was raised to 50° C., the reaction was carried out for 40 hours. The reaction solution was concentrated by half and 5.0 liters of methanol was added for precipitation into the solution. The obtained white solid was filtered, and then dried under reduced pressure at 40° C. to obtain 282 g of a white polymer. This polymer was redissolved into 0.5 liter of methanol and 0.6 liter of tetrahydrofurane, added by 160 g of triethylamine and 30 g of water, and then the deprotection reaction was carried out by heating at 60° C. The reaction solution was neutralized by acetic acid, concentrated, dissolved into 0.5 liter of acetone, and then poured into 10 liters of water in a similar manner to those as mentioned above. The precipitated solid was filtered and dried to obtain 182 g of a white polymer. A $^{13}$C-NMR, a $^{1}$H-NMR, and a GPC of the polymer thus obtained were measured to obtain the following analysis results.
Copolymer Composition Ratio:
    Hydroxystyrene:acenaphthylene=89.3:10.7
    Weight-average molecular weight (Mw):6,800
    Molecular weight distribution (Mw/Mn):1.75
This polymer is designated as (poly-4).

Synthesis Example 5

Into a 1-liter flask were charged 293.3 g of acetoxystyrene, 206.7 g of indene, and 700 g of toluene as a solvent. The flask was cooled to −70° C. under a nitrogen atmosphere, and the procedure of a deaeration under vacuum followed by a nitrogen flow was repeated three times. After heated to a room temperature, 14.6 g of AIBN was added as a polymerization initiator. After the temperature was raised to 50° C., the reaction was carried out for 40 hours. The reaction solution was concentrated by half and 5.0 liters of methanol was added for precipitation into the solution. The obtained white solid was filtered, and then dried under reduced pressure at 40° C. to obtain 260 g of a white polymer. This polymer was redissolved into 0.4 liter of methanol and 0.5 liter of tetrahydrofurane, added by 140 g of triethylamine and 30 g of water, and then the deprotection reaction was carried out by heating at 60° C. The reaction solution was neutralized by acetic acid, concentrated, dissolved into 0.5 liter of acetone, and then poured into 10 liters of water in a similar manner to those as mentioned above. The precipitated solid was filtered and dried to obtain 175 g of a white polymer. A $^{13}$C-NMR, a $^{1}$H-NMR, and a GPC of the polymer thus obtained were measured to obtain the following analysis results.
Copolymer Composition Ratio:
    Hydroxystyrene:indene=89.0:11.0
    Weight-average molecular weight (Mw):6,800
    Molecular weight distribution (Mw/Mn):1.81
This polymer is designated as (poly-5).

Synthesis Example 6

Into a 3-liter flask were charged 268.8 g of acetoxystyrene, 31.2 g of acenaphthylene, and 1,200 g of toluene as a solvent. The flask was cooled to −70° C. under a nitrogen atmosphere, and the procedure of a deaeration under vacuum followed by a nitrogen flow was repeated three times. After heated to a room temperature, 23.1 g of 2,2'-azobis(2,4-dimethylvaleronitrile (V-65, manufactured by Wako Pure Chemical Industries, Ltd.) was added as a polymerization initiator. After the temperature was raised to 45° C., the reaction was carried out for 20 hours, and then the temperature was raised to 55° C. and the reaction was carried out for 20 hours, thereby performed a two-stages polymerization. A mixed solution of 700 g of methanol and 150 g of water was poured dropwise into the reaction solution with agitation, and after 30 minutes, a lower layer (polymer layer) was concentrated under reduced pressure, and then redissolved into 0.32 liter of methanol and 0.36 liter of tetrahydrofurane. It was added by 108 g of triethylamine and 21 g of water, and then the deprotection reaction was carried out by heating at 60° C. for 40 hours. The deprotected reaction solution was concentrated under reduced pressure, dissolved by adding 365 g of methanol and 75 g of acetone, and then added by 990 g of hexane dropwise with agitation. After 30 minutes, a lower layer (polymer layer) was concentrated under reduced pressure, neutralized by 65 g of acetic acid, concentrated, dissolved into 0.15 liter of acetone, and then poured into 10 liters of water in a similar manner to those as mentioned above. The precipitated solid was filtered and dried to obtain 184 g of a white polymer. A $^{13}$C-NMR, a $^1$H-NMR, and a GPC of the polymer thus obtained were measured to obtain the following analysis results.
Copolymer Composition Ratio:
  Hydroxystyrene:acenaphthylene=87.9:12.1
  Weight-average molecular weight (Mw):3,000
  Molecular weight distribution (Mw/Mn):1.58
This polymer is designated as (poly-6).

Synthesis Example 7

Into a 1-liter flask were charged 50.0 g of hydroxystyrene-acenaphthylene copolymer (poly-1) and 400 g of tetrahydrofurane as a solvent. After the flask was cooled to 5° C. under a nitrogen atmosphere, 31.0 g of triethylamine was added, and then 14.9 g of acetal-forming agent A was charged dropwise into it during one hour. The temperature was raised to room temperature, and then the reaction was carried out for 4 hours. The reaction solution was concentrated, dissolved into 200 g of acetone, and then precipitated into 7.0 liters of water for neutralization by acetic acid and for washing. The obtained white solid was filtered and dried under reduced pressure at 40° C. to obtain 54.0 g of a white polymer. A $^{13}$C-NMR, a $^1$H-NMR, and a GPC of the polymer thus obtained were measured to obtain the following analysis results.
Copolymer Composition Ratio:
  Hydroxystyrene:acenaphthylene:4-methoxyisobutoxystyrene=69.9:10.7:19.4
  Weight-average molecular weight (Mw):6,900
  Molecular weight distribution (Mw/Mn):1.76
This polymer is designated as (poly-7).
In a similar manner to that of Synthesis Example 7, the acetal-formation reaction of poly-4 was carried out to obtain poly-11 as shown below.
  Hydroxystyrene:acenaphthylene:4-methoxyisobutoxystyrene=70.8:10.7:18.5
  Weight-average molecular weight (Mw):7,800
  Molecular weight distribution (Mw/Mn):1.72

Synthesis Example 8

Into a 1-liter flask were charged 200.0 g of hydroxystyrene-acenaphthylene copolymer (poly-1) and 1,800 g of tetrahydrofurane as a solvent. Under a nitrogen atmosphere at near 25° C., 120 g of triethylamine was added, and then 50.4 g of acetal-forming-agent B was charged dropwise into it during 30 minutes. The reaction was carried out for 3 hours at room temperature. The reaction solution was concentrated, dissolved into 400 g of acetone, and then precipitated into 10.0 liters of water for neutralization by acetic acid and for washing. The obtained white solid was filtered and dried under reduced pressure at 40° C. to obtain 211 g of a white polymer. A $^{13}$C-NMR, a $^1$H-NMR, and a GPC of the polymer thus obtained were measured to obtain the following analysis results.
Copolymer Composition Ratio:
  Hydroxystyrene:acenaphthylene:4-tricyclodecaneoxy-isobutoxystyrene=78.4:10.8:10.8
  Weight-average molecular weight (Mw):6,400
  Molecular weight distribution (Mw/Mn):1.68
This polymer is designated as (poly-8).
In a similar manner to that of Synthesis Example 8, each of the acetal-formation reactions of base polymers poly-2, -3, -4, -5, and -6 was carried out to obtain the following poly-9, -10, -12, -13, and -14, respectively. The data of these polymers are shown in Table 1.

TABLE 1

| Polymer | Composition ratio (%) | | | Molecular weight (Mw) | Molecular weight dispersion (Mw/Mn) |
|---|---|---|---|---|---|
| poly-8 | 78.4 | 10.8 | 10.8 | 6400 | 1.68 |
| poly-9 | 79.7 | 12.2 | 8.1 | 5100 | 1.59 |
| poly-10 | 80 | 11 | 9 | 5300 | 1.63 |
| poly-12 | 80.3 | 10.9 | 8.8 | 7900 | 1.74 |
| poly-13 | 79.8 | 11 | 9.2 | 7700 | 1.82 |
| poly-14 | 75.5 | 12.2 | 12.3 | 3600 | 1.55 |

(Composition ratio in Table 1 is obtained from $^1$H-NMR and shown by hydroxystyrene:acenaphthylene:4-tricyclodecaneoxyisobutoxystyrene.)

In the following, structures of acetal-forming agent A, acetal-forming agent B, and poly-7 to poly-14 are shown.

Acetal-forming agent A

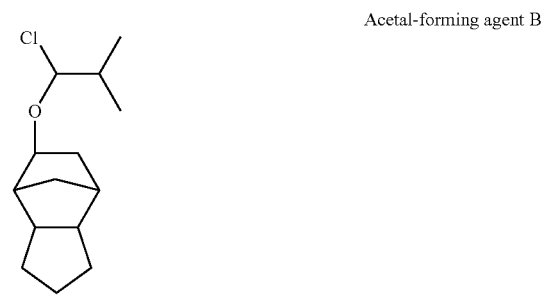

Acetal-forming agent B

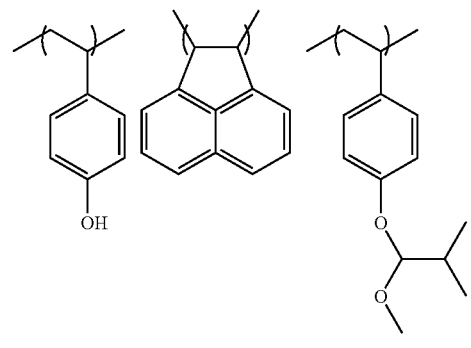

poly-7,11

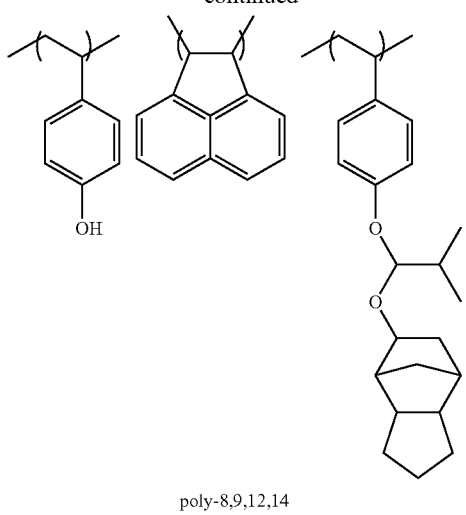

poly-8,9,12,14

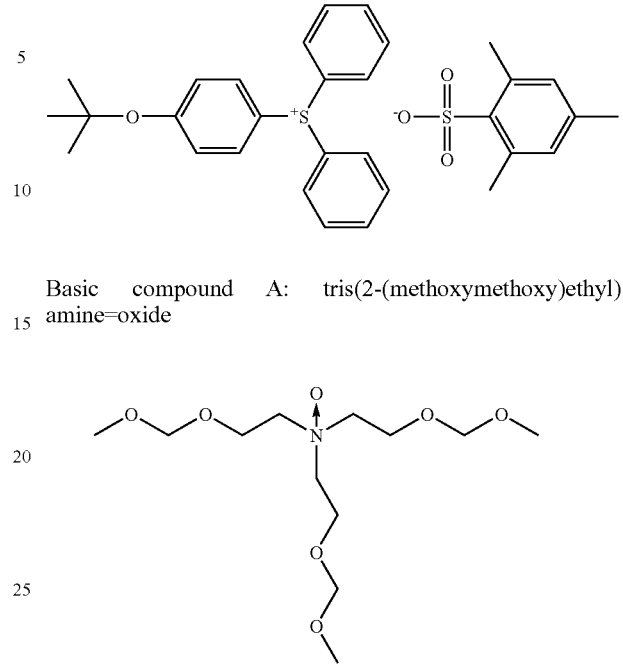

Basic compound A: tris(2-(methoxymethoxy)ethyl)amine=oxide

Surfactant and solvents as shown below were used.
Surfactant A: KH-20 (manufactured by Asahi Glass Co., Ltd.)
Solvent A: propyleneglycol methyl ether acetate
Solvent B: ethyl lactate poly-10,13

Resist compositions shown in Tables 2 and 3 were prepared. Each of resist compositions shown in Tables 2 and 3 was prepared by using each of polymers, poly-7 to poly-14, obtained in the above-mentioned Syntheses Examples, wherein other components were as following. Acid-generators and basic compounds used are shown below.

Acid-Generator.

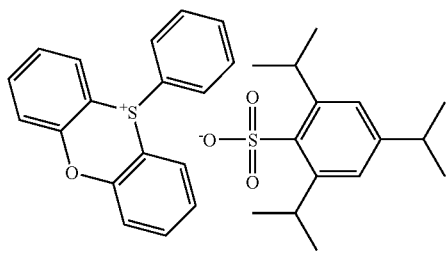

PAG-1

TABLE 2

| Composition | Example 1 | Example 2 | Example 3 | Example 4 |
|---|---|---|---|---|
| Poly-7 | 80 | — | — | — |
| Poly-8 | — | 80 | — | — |
| Poly-9 | — | — | 80 | — |
| Poly-10 | — | — | — | 80 |
| PAG-1 | 7 | 7 | 7 | 7 |
| PAG-2 | 1 | 1 | 1 | 1 |
| Basic compound A | 0.2 | 0.2 | 0.2 | 0.2 |
| Surfactant A | 0.07 | 0.07 | 0.07 | 0.07 |
| Solvent A | 560 | 560 | 560 | 560 |
| Solvent B | 1320 | 1320 | 1320 | 1320 |

TABLE 3

| Composition | Comparative Example 1 | Comparative Example 2 | Comparative Example 3 | Comparative Example 4 |
|---|---|---|---|---|
| Poly-11 | 80 | — | — | — |
| Poly-12 | — | 80 | — | — |
| Poly-13 | — | — | 80 | — |
| Poly-14 | — | — | — | 80 |
| PAG-1 | 7 | 7 | 7 | 7 |
| PAG-2 | 1 | 1 | 1 | 1 |
| Basic compound A | 0.2 | 0.2 | 0.2 | 0.2 |
| Surfactant A | 0.07 | 0.07 | 0.07 | 0.07 |
| Solvent A | 560 | 560 | 560 | 560 |
| Solvent B | 1320 | 1320 | 1320 | 1320 |

Each of resist compositions obtained was filtered through a filter with 0.02 micrometer pore size made of a nylon resin, and then this resist solution was applied on a mask blanks by spin coating with 0.15 micrometer in thickness.

Then, this mask blanks was baked on a hot plate at 90° C. for 10 minutes, exposed by an electron beam irradiator (EBM-5000plus, manufactured by NuFlare Technology, Inc., acceleration voltage of 50 keV), baked at 90° C. for 10 minutes as PEB (PEB: post exposure bake), and then developed by an aqueous 2.38% tetramethyl ammonium hydroxide to obtain a positive pattern (Examples 1 to 4, and Comparative Examples 1 to 4).

Resist patterns thus obtained were evaluated as following.

Exposure dose to resolve a top and a bottom of 1:1 line-and-space with 0.02 micrometer was taken as an optimum exposure dose (sensitivity: Eop), and the resolved minimum line width of the line-and-space whose resist pattern was separated and moreover not fallen down with this exposure dose was taken as the resolution of the evaluating resist. The resolved resist pattern profile was observed at the cross section of the resist by a scanning electron microscope.

In addition, a line width (CD) of a space part of a 1:1 line-and-space pattern with 0.40 micrometer and 0.20 micrometer was measured by a CD-SEM. The measurement was made at each 20 spots of the pattern made on the substrate, and the variance of the space line width was measured as the line edge roughness (LER). Three-sigma value of the CD values at total 40 spots obtained was taken as LER. When this line edge roughness (LER) is smaller, the line edge roughness (LER) of the resist pattern on the mask blanks is smaller and thus better.

Evaluation results of the resists are shown in Table 4.

TABLE 4

| Comparative Example and Example | Resolution | Pattern Profile | LER | Polymer molecular weight |
|---|---|---|---|---|
| Comparative Example 1 | 0.07 | Negative profile | 7.2 | 7800 |
| Comparative Example 2 | 0.06 | Concave profile (Constricted middle) | 7.6 | 7900 |
| Comparative Example 3 | 0.08 | Concave profile (Constricted middle) | 6.9 | 7700 |
| Comparative Example 4 | 0.07 | Top loss | 6.8 | 3600 |
| Example 1 | 0.05 | Rectangular | 5.6 | 6900 |
| Example 2 | 0.055 | Rectangular | 5.4 | 6400 |
| Example 3 | 0.45 | Rectangular | 4.8 | 5100 |
| Example 4 | 0.05 | Rectangular | 5 | 5300 |

A relationship between the molecular weight (Mw) of the polymer and the line edge roughness (LER) is shown in FIG. 1. As can be seen in FIG. 1, the line edge roughness (LER) is good when the molecular weight is 4,000 to 7,000.

It must be stated here that the present invention is not restricted to the embodiments shown by Examples. The embodiments shown by Examples are merely examples so that any embodiments composed of substantially the same technical concept as disclosed in the claims of the present invention and expressing a similar effect are included in the technical scope of the present invention.

What is claimed is:

1. A resist patterning process with a minimum line width or a minimum space width being 65 nanometers or less on a processing substrate, comprising (i) coating a chemically-amplified positive resist composition containing a base polymer on a processing substrate, (ii) removing an excess solvent component remained in the coated film by heating to obtain a resist film, (iii) pattern-exposing a high energy beam, and (iv) developing by using a developer, wherein the base polymer is a polymer comprising:

at least one or more monomer unit represented by the following general formula (1), wherein the polymer always contains a unit with t being one or more:

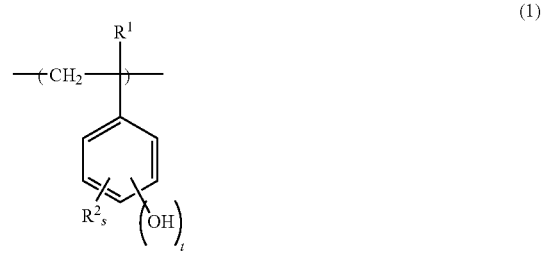

(1)

wherein $R^1$ represents a hydrogen atom or a methyl group; and $R^2$ represents a hydrocarbon, or an alkoxy hydrocarbon group having 1 to 6 carbon atoms, wherein t represents an integer of 0 to 2; and s represents an integer of 0 to 4, and $0<s+t\leq5$; a phenolic hydroxyl group is partly protected by an acid labile protecting group when t is one or two, and one or more monomer unit represented by the following general formula (2);

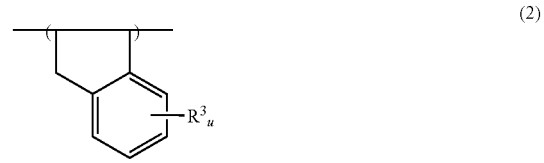

(2)

wherein $R^3$ represents any of a hydroxyl group, a hydrocarbon, or an alkoxy hydrocarbon group having 1 to 6 carbon atoms, wherein u represents an integer of 0 to 4; and/or one or more monomer unit represented by the following general formula (3);

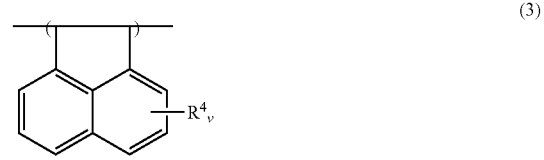

(3)

wherein $R^4$ represents a hydroxyl group, a hydrocarbon, or an alkoxy hydrocarbon group having 1 to 6 carbon atoms wherein v represents an integer of 0 to 4, wherein the phenolic hydroxyl group in the monomer unit represented by the formula (1) is partly protected by the acid labile protecting group, wherein the sum of the monomers represented by the formulae (1) to (3) relative to total monomer units of the polymer is 95 mol % or more, the amount of monomers with t being one or more is 70 mol % or more relative to total monomer units of the formula (1) when two or more monomers represented by the formula (1) are contained, a sum of monomer units represented by the formulae (2) and (3) relative to total monomer units of the polymer is 5 to 30 mol %, and wherein a weight-average molecular weight of the polymer is 4,000 to 7,000.

2. The resist patterning process according to claim 1, wherein the weight-average molecular weight is 4,500 to 5,500.

3. The resist patterning process according to claim 1, wherein the acid labile protecting group to protect the phenolic hydroxyl group in the monomer unit represented by general formula (1) is an acetal group represented by the following general formula (4):

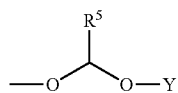

(4)

wherein $R^5$ represents a hydrogen atom, or a linear, a branched, or a cyclic alkyl group having 1 to 10 carbon atoms; and Y represents a linear, a branched, or a cyclic (including polycyclic) alkyl group having 1 to 30 carbon atoms.

4. The resist patterning process according to claim 2, wherein the acid labile protecting group to protect the phenolic hydroxyl group in the monomer unit represented by general formula (1) is an acetal group represented by the following general formula (4):

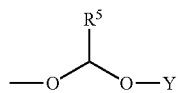

(4)

wherein $R^5$ represents a hydrogen atom, or a linear, a branched, or a cyclic alkyl group having 1 to 10 carbon atoms; and Y represents a linear, a branched, or a cyclic (including polycyclic) alkyl group having 1 to 30 carbon atoms.

5. A method for producing a photo mask for manufacturing of a semiconductor device with a pattern rule of 65 nanometers or less, wherein the method includes a step of processing a photo mask blank by forming a resist pattern on the mask blank by the resist patterning process according to claim 1.

6. A method for producing a photo mask for manufacturing of a semiconductor device with a pattern rule of 65 nanometers or less, wherein the method includes a step of processing a photo mask blank by forming a resist pattern on the mask blank by the resist patterning process according to claim 2.

7. A method for producing a photo mask for manufacturing of a semiconductor device with a pattern rule of 65 nanometers or less, wherein the method includes a step of processing a photo mask blank by forming a resist pattern on the mask blank by the resist patterning process according to claim 3.

8. A method for producing a photo mask for manufacturing of a semiconductor device with a pattern rule of 65 nanometers or less, wherein the method includes a step of processing a photo mask blank by forming a resist pattern on the mask blank by the resist patterning process according to claim 4.

9. The resist patterning process according to claim 1, wherein the weight-average molecular weight is 4,000 to 5,500.

* * * * *